United States Patent
Kim et al.

(10) Patent No.: US 12,185,459 B2
(45) Date of Patent: Dec. 31, 2024

(54) FLEXIBLE PRINTED CIRCUIT BOARD HAVING VERTICAL SECTION AND HORIZONTAL SECTION

(71) Applicant: GigaLane Co., Ltd., Hwaseong-si (KR)

(72) Inventors: Sang Pil Kim, Hwaseong-si (KR); Ik Soo Kim, Hwaseong-si (KR); Byung Yeol Kim, Hwaseong-si (KR); Hee Seok Jung, Hwaseong-si (KR)

(73) Assignee: GigaLane Co., Ltd., Hwaseong-si (KR)

( * ) Notice: Subject to any disclaimer, the term of this patent is extended or adjusted under 35 U.S.C. 154(b) by 634 days.

(21) Appl. No.: 17/428,339

(22) PCT Filed: Mar. 31, 2020

(86) PCT No.: PCT/KR2020/004430
§ 371 (c)(1),
(2) Date: Aug. 4, 2021

(87) PCT Pub. No.: WO2020/209538
PCT Pub. Date: Oct. 15, 2020

(65) Prior Publication Data
US 2022/0151064 A1     May 12, 2022

(30) Foreign Application Priority Data

Apr. 12, 2019 (KR) .................. 10-2019-0043287
May 24, 2019 (KR) .................. 10-2019-0061286

(51) Int. Cl.
*H05K 1/02* (2006.01)
*H05K 1/11* (2006.01)
*H05K 1/14* (2006.01)

(52) U.S. Cl.
CPC .......... *H05K 1/0298* (2013.01); *H05K 1/028* (2013.01); *H05K 1/115* (2013.01); *H05K 1/118* (2013.01);
(Continued)

(58) Field of Classification Search
CPC ......... H05K 2201/05; H05K 2201/058; H05K 2201/0681; H05K 1/028; H05K 1/118;
(Continued)

(56) References Cited

U.S. PATENT DOCUMENTS

2013/0256001 A1  10/2013  Sakai
2017/0033426 A1*  2/2017  Baba .................. H05K 1/0298
(Continued)

FOREIGN PATENT DOCUMENTS

JP           5273320 B2    8/2013
JP        2015130498 A    7/2015
(Continued)

OTHER PUBLICATIONS

International Search Report from International Application No. PCT/KR2020/004430, mailed Jul. 9, 2020.

*Primary Examiner* — Steven T Sawyer
(74) *Attorney, Agent, or Firm* — Shih IP Law Group, PLLC.

(57) ABSTRACT

A flexible circuit board comprises: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a vertical section in which the first signal line and the second signal line are located on a same vertical line and the first signal line and the second signal line extend in parallel; and a horizontal section in which the position of the first signal line or the second signal line is changed through a via hole.

18 Claims, 39 Drawing Sheets

(52) U.S. Cl.
CPC ....... *H05K 1/147* (2013.01); *H05K 2201/056* (2013.01)

(58) Field of Classification Search
CPC ........ H05K 1/147; H05K 1/148; H05K 1/189; H05K 1/0298
See application file for complete search history.

(56) References Cited

U.S. PATENT DOCUMENTS

| | | |
|---|---|---|
| 2017/0073215 A1 | 3/2017 | Bergeron |
| 2019/0088388 A1* | 3/2019 | Baba ........................ H05K 1/11 |
| 2019/0297722 A1* | 9/2019 | Baba ........................ H01P 3/085 |
| 2020/0161271 A1* | 5/2020 | Mori .................... H05K 1/0298 |
| 2020/0178389 A1* | 6/2020 | Min ..................... H05K 3/4691 |
| 2021/0307168 A1* | 9/2021 | Iwasaki ................. A61B 3/113 |

FOREIGN PATENT DOCUMENTS

| | | |
|---|---|---|
| KR | 20170133874 A | 12/2017 |
| KR | 101824644 B1 | 2/2018 |

\* cited by examiner

FLEXIBLE PRINTED CIRCUIT BOARD HAVING VERTICAL SECTION AND HORIZONTAL SECTION

CROSS-REFERENCE TO RELATED APPLICATIONS

This Application is a U.S. national phase application under 35 U.S.C. § 371 of PCT Application No. PCT/KR2020/004430 filed on Mar. 31, 2020, which claims the benefit of Korean Patent Application No. 10-2019-0043287 filed on Apr. 12, 2019 and Korean Patent Application No. 10-2019-0061286 filed on May 24, 2019, the entire disclosures of which are incorporated herein by reference.

TECHNICAL FIELD

The present invention relates to a flexible circuit board having a vertical section and a horizontal section.

BACKGROUND

As illustrated in FIG. 1, a flexible circuit board 1 including a signal line used for transmitting a high frequency signal between an antenna and an antenna element is disposed to be in surface contact with a housing 2 by folding a partial section to be disposed in a narrow space in a wireless terminal (e.g., a smartphone, a tablet, a notebook, etc.).

In the case of the flexible circuit board 1 including a plurality of signal lines for transmitting a plurality of high frequency signals, when the plurality of signal lines is disposed to be located on the same vertical line (e.g., an arrangement form of signal lines illustrated in FIG. 3), the radius of curvature increases, and thus the folding is difficult. Accordingly, in order to decrease the radius of curvature, the plurality of signal lines is disposed to be located on the same horizontal line (e.g., an arrangement form of signal lines illustrated in FIG. 5).

However, in the case of the flexible circuit board 1 in which the plurality of signal lines is disposed to be located on the same horizontal line, the width thereof is increased as compared to that of the flexible circuit board 1 in which the plurality of signal lines is disposed to be located on the same vertical line. Accordingly, due to the increased width, there is a problem that it is difficult to dispose the flexible circuit board 1 in a narrow space in the wireless terminal.

SUMMARY

Technical Problem

An object of the present invention is to provide a flexible circuit board having a vertical section and a horizontal section.

Technical Solution

A flexible circuit board having a vertical section and a horizontal section according to an embodiment of the present invention includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a vertical section which is a section in which the first signal line and the second signal line are located on the same vertical line and the first signal line and the second signal line extend in parallel; and a horizontal section which is a section in which the position of the first signal line or the second signal line is changed through a via hole and the first signal line and the second signal line are located on the same horizontal line.

A flexible circuit board having a vertical section and a horizontal section includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a third dielectric which is located below the second dielectric, has a third signal line in contact with the upper or lower surface thereof, has a greater width than the third signal line, and extends along an extension direction of the third signal line; a vertical section which is a section in which the first signal line, the second signal line, and the third signal line are located on the same vertical line and the first signal line, the second signal line, and the third signal line extend in parallel; and a horizontal section which is a section in which the positions of two or more of the first signal line, the second signal line, and the third signal line are changed through a via hole, so that the first signal line, the second signal line, and the third signal line are located on the same horizontal line.

The horizontal section includes a first horizontal section which is a section which extends from the vertical section and of which a position of the signal line is changed through the via hole; and a second horizontal section which extends from the first horizontal section so that the second horizontal section is thinner than the first horizontal section and intervals are formed between the first dielectric and the second dielectric and between the second dielectric and the third dielectric.

A flexible circuit board having a vertical section and a horizontal section includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a vertical section which is a section in which the first signal line and the second signal line are located on the same vertical line and the first signal line and the second signal line extend in parallel; and a horizontal section which is a section in which the position of the first signal line is changed to be in contact with the upper surface or lower surface of the second dielectric through the first via hole so that the first signal line is spaced apart from the second signal line in a horizontal direction.

The flexible circuit board having the vertical section and the horizontal section further includes a third dielectric which is located below the second dielectric, has a third signal line in contact with the upper or lower surface thereof, has a greater width than the third signal line, and extends along an extension direction of the third signal line, wherein in the vertical section, the second signal line and the third signal line are located on the same vertical line and the second signal line and the third signal line extend in parallel, and in the horizontal section, the position of the third signal line is changed to be in contact with the upper surface or lower surface of the second dielectric through the third via hole so that the third signal line is spaced apart from the second signal line in a horizontal direction.

The horizontal section includes a first horizontal section which is a section which extends from the vertical section, and in which the positions of the first signal line and the third signal line are changed through the first via hole and the third via hole; and a second horizontal section from which at least one of the first dielectric and the third dielectric is removed so as to be thinner than the first horizontal section.

The flexible circuit board having the vertical section and the horizontal section further includes a first sub dielectric which has a first sub ground in contact with the upper surface or lower surface thereof and is located between the first dielectric and the second dielectric; a second sub dielectric which has a second sub ground in contact with the upper surface or lower surface thereof and is located between the second dielectric and the third dielectric; a first side dielectric which has a first side ground in contact with the upper surface or lower surface thereof and is located on the first dielectric; and a second side dielectric which has a second side ground in contact with the upper surface or lower surface thereof and is located lower the third dielectric, wherein in the second horizontal section, at least one of the first sub dielectric, the second sub dielectric, the first side dielectric, and the second side dielectric is removed.

The horizontal section includes a first horizontal section which is a section which extends from the vertical section and in which a gap between the first dielectric and the second dielectric and a gap between the second dielectric and the third dielectric are bonded to each other by direct thermal melt bonding or by any one a bonding sheet and a prepreg as a medium; and a second horizontal section which is a section which extends from the first horizontal section and in which a gap between the first dielectric and the second dielectric and a gap between the second dielectric and the third dielectric are separated from each other without being bonded by the thermal melt bonding or the medium.

The flexible circuit board having the vertical section and the horizontal section further includes a first sub dielectric which has a first sub ground in contact with the upper surface or lower surface thereof and is located between the first dielectric and the second dielectric; a second sub dielectric which has a second sub ground in contact with the upper surface or lower surface thereof and is located between the second dielectric and the third dielectric; a first side dielectric which has a first side ground in contact with the upper surface or lower surface thereof and is located on the first dielectric; and a second side dielectric which has a second side ground in contact with the upper surface or lower surface thereof and is located lower the third dielectric, wherein in the second horizontal section, the first dielectric is separated from the first sub dielectric and the first side dielectric, and in the second horizontal section, the third dielectric is separated from the second sub dielectric and the second side dielectric.

In the second horizontal section, the second dielectric is separated from the first sub dielectric and the second sub dielectric.

The horizontal section includes a first horizontal section which is a section which extends from the vertical section and has the first via hole and the third via hole; and a second horizontal section which is a section in which the positions of the first signal line and the third signal line are changed through the first via hole and the third via hole, and the flexible circuit board having the vertical section and the horizontal section further includes: a first ground which is in contact with the same surface in contact with the first signal line of the first dielectric so as to be formed around the first signal line in the vertical section and the first horizontal section; a second ground which is in contact with the same surface in contact with the second signal line of the second dielectric so as to be formed around the second signal line in the vertical section and the first horizontal section; and a third ground which is in contact with the same surface in contact with the third signal line of the third dielectric so as to be formed around the third signal line in the vertical section and the first horizontal section.

The flexible circuit board having the vertical section and the horizontal section further includes a ground via hole which vertically passes through the first ground, the second ground, and the third ground so that the first ground, the second ground, and the third ground are electrically connected to each other around a portion formed with the first via hole and the third via hole.

A flexible circuit board having a vertical section and a horizontal section includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a third dielectric which is located below the second dielectric, has a third signal line in contact with the upper or lower surface thereof, has a greater width than the third signal line, and extends along an extension direction of the third signal line; a vertical section which is a section in which the first signal line, the second signal line, and the third signal line are located on the same vertical line and the first signal line, the second signal line, and the third signal line extend in parallel; and a horizontal section which is a section in which the positions of the second signal line and the third signal line are changed to be in contact with the upper surface or lower surface of the first dielectric through the second via hole and the third via hole, respectively, to be spaced apart from the first signal line in a horizontal direction.

A flexible circuit board having a vertical section and a horizontal section includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a third dielectric which is located below the second dielectric, has a third signal line in contact with the upper or lower surface thereof, has a greater width than the third signal line, and extends along an extension direction of the third signal line; a vertical section which is a section in which the first signal line, the second signal line, and the third signal line are located on the same vertical line and the first signal line, the second signal line, and the third signal line extend in parallel; and a horizontal section which is a section in which the positions of the first signal line and the second signal line are changed to be in contact with the upper surface or lower surface of the third dielectric through the first via hole and the second via hole, respectively, to be spaced apart from the third signal line in a horizontal direction.

A flexible circuit board having a vertical section and a horizontal section includes: a first dielectric which has a first signal line in contact with an upper surface or lower surface thereof, has a greater width than the first signal line, and extends along an extension direction of the first signal line; a second dielectric which is located below the first dielectric, has a second signal line in contact with the upper or lower surface thereof, has a greater width than the second signal line, and extends along an extension direction of the second signal line; a third dielectric which is located below the second dielectric, has a third signal line in contact with the upper or lower surface thereof, has a greater width than the third signal line, and extends along an extension direction of the third signal line; a first sub dielectric which is located between the first dielectric and the second dielectric, has a width corresponding to the second dielectric, and extends along an extension direction of the second dielectric; a second sub dielectric which is located between the second dielectric and the third dielectric, has a width corresponding to the second dielectric, and extends along an extension direction of the second dielectric; a vertical section which is a section in which the first signal line, the second signal line, and the third signal line are located on the same vertical line and the first signal line, the second signal line, and the third signal line extend in parallel; and a horizontal section which is a section in which the positions of the first signal line and the third signal line are changed to be in contact with the upper surface or lower surface of the first sub dielectric through the first via hole and the third via hole, respectively, or to be in contact with the upper surface or lower surface of the second sub dielectric to be spaced apart from the second signal line in a horizontal direction.

In the horizontal section, the horizontal widths of the first dielectric, the second dielectric, and the third dielectric are larger than a width at which the first signal line and the third signal line are spaced from each other in the horizontal direction.

The horizontal section includes a first-A bending section which is a section in which the first signal line extends from the vertical section to be bent in a horizontal direction of the vertical section; a first-A extension section which is a section in which the first signal line extends from the first-A bending section in a direction bent by the first-A bending section; a first-B bending section which is a section in which the first signal line extends from the first-A extension section to be bent in a horizontal direction of the first-A extension section; a first-B extension section which is a section in which the first signal line extends from the first-B bending section in a direction bent by the first-B bending section; a first-A change section which is a section in which the position of the first signal line is changed to be in contact with the upper surface or lower surface of the second dielectric through the first via hole; and a first-C extension section which is a section in which the first signal line extends from the first-A change section in the same direction as the first-B extension section.

The horizontal section further includes a second-A extension section in which the second signal line extends from the vertical section in the same direction as the vertical section.

The horizontal section includes a third-A bending section which is a section in which the third signal line extends from the vertical section to be bent in a horizontal direction of the vertical section; a third-A extension section which is a section in which the third signal line extends from the third-A bending section in a direction bent by the third-A bending section; a third-B bending section which is a section in which the third signal line extends from the third-A extension section to be bent in a horizontal direction of the third-A extension section; a third-B extension section which is a section in which the third signal line extends from the third-B bending section in a direction bent by the third-B bending section; a third-A change section which is a section in which the position of the third signal line is changed to be in contact with the upper surface or lower surface of the second dielectric through the third via hole; and a third-C extension section which is a section in which the third signal line extends from the third-A change section in the same direction as the third-B extension section.

The horizontal section includes a first-A bending section which is a section in which the first signal line extends from the vertical section to be bent in a horizontal direction of the vertical section; a first-B bending section which is a section in which the first signal line extends from the first-A bending section to be bent in a horizontal direction of a direction bent by the first-A bending section; a first-B extension section which is a section in which the first signal line extends from the first-B bending section in a direction bent by the first-B bending section; a first-A change section which is a section in which the position of the first signal line is changed to be in contact with the upper surface or lower surface of the second dielectric through the first via hole; a first-C extension section which is a section in which the first signal line extends from the first-A change section in the same direction as the first-B extension section; a second-A extension section which is a section in which the second signal line extends from the vertical section in the same direction as the vertical section; a third-A bending section which is a section in which the third signal line extends from the vertical section to be bent in a horizontal direction of the vertical section; a third-B bending section which is a section in which the third signal line extends from the third-A bending section to be bent in a horizontal direction of a direction bent by the third-A bending section; a third-B extension section which is a section which the third signal line extends from the third-B bending section in a direction bent by the third-B bending section; a third-A change section which is a section in which the position of the third signal line is changed to be in contact with the upper surface or lower surface of the second dielectric through the third via hole; and a third-C extension section which is a section in which the third signal line extends from the third-A change section in the same direction as the third-B extension section.

The horizontal section includes a first-A bending section which is a section in which the first signal line extends from the vertical section to be bent in a horizontal direction of the vertical section; a first-A extension section which is a section in which the first signal line extends from the first-A bending section in a direction bent by the first-A bending section; a first-A change section which is a section in which the position of the first signal line is changed through the first via hole; and a first-B extension section which is a section in which the first signal line extends from the first-A change section in the same direction as the first-A extension section.

The horizontal section includes a second-A bending section which is a section in which the second signal line extends from the vertical section to be bent in a horizontal direction of the vertical section; and a second-A extension section which is a section in which the second signal line extends from the second-A bending section in a direction bent by the second-A bending section.

The horizontal section includes a third-A bending section which is a section in which the third signal line extends from the vertical section to be bent in a horizontal direction of the vertical section; a third-A extension section which is a section in which the third signal line extends from the third-A bending section in a direction bent by the third-A bending section; a third-A change section which is a section in which the position of the third signal line is changed through the third via hole; and a third-B extension section which is a section in which the third signal line extends from the third-A change section in the same direction as the third-A extension section.

The horizontal section includes a first-A bending section which is a section in which the first signal line extends from the vertical section to be bent in a horizontal direction of the vertical section; a first-A extension section which is a section in which the first signal line extends from the first-A bending section in a direction bent by the first-A bending section; a first-A change section which is a section in which the position of the first signal line is changed through the first via hole; a first-B bending section which is a section in which the first signal line extends from the first-A change section in the same direction as the first-A extension section; a first-B bending section which is a section which extends from the second-B extension section to be bent in a horizontal direction of the first-B extension section; and a first-C extension section which is a section in which the first signal line extends from the first-B bending section in a direction bent by the first-B bending section.

The horizontal section includes a second-A bending section which is a section in which the second signal line extends from the vertical section to be bent in a horizontal direction of the vertical section; a second-A extension section which is a section in which the second signal line extends from the second-A bending section in a direction bent by the second-A bending section; a second-B bending section which is a section which extends from the second-A extension section to be bent in a horizontal direction of the second-A extension section; and a second-B extension section which is a section in which the second signal line extends from the second-B bending section in a direction bent by the second-B bending section.

The horizontal section includes a third-A bending section which is a section in which the third signal line extends from the vertical section to be bent in a horizontal direction of the vertical section; a third-A extension section which is a section in which the third signal line extends from the third-A bending section in a direction bent by the third-A bending section; a third-A change section which is a section in which the position of the third signal line is changed through the third via hole; a third-B extension section which is a section in which the third signal line extends from the third-A change section in the same direction as the third-A extension section; a third-B bending section which is a section which extends from the third-B extension section to be bent in a horizontal direction of the third-B extension section; and a third-C extension section which is a section in which the third signal line extends from the third-B bending section in a direction bent by the third-B bending section.

The horizontal section includes a first horizontal section which is a section which extends from the vertical section, and in which the positions of the first signal line and the third signal line are changed through the first via hole and the third via hole; and a second horizontal section from which at least one of the first dielectric and the third dielectric is removed so as to be thinner than the first horizontal section.

The flexible circuit board having the vertical section and the horizontal section further includes a first sub dielectric which has a first sub ground in contact with the upper surface or lower surface thereof and is located between the first dielectric and the second dielectric; a second sub dielectric which has a second sub ground in contact with the upper surface or lower surface thereof and is located between the second dielectric and the third dielectric; a first side dielectric which has a first side ground in contact with the upper surface or lower surface thereof and is located on the first dielectric; and a second side dielectric which has a second side ground in contact with the upper surface or lower surface thereof and is located below the third dielectric, wherein in the second horizontal section, at least one of the first sub dielectric, the second sub dielectric, the first side dielectric, and the second side dielectric is removed.

The horizontal section includes a first horizontal section which is a section which extends from the vertical section and in which a gap between the first dielectric and the second dielectric and a gap between the second dielectric and the third dielectric are bonded to each other by direct thermal melt bonding or by any one a bonding sheet and a prepreg as a medium; and a second horizontal section which is a section which extends from the first horizontal section and in which a gap between the first dielectric and the second dielectric and a gap between the second dielectric and the third dielectric are separated from each other without being bonded by the thermal melt bonding or the medium.

The flexible circuit board having the vertical section and the horizontal section further includes a first sub dielectric which has a first sub ground in contact with the upper surface or lower surface thereof and is located between the first dielectric and the second dielectric; a second sub dielectric which has a second sub ground in contact with the upper surface or lower surface thereof and is located between the second dielectric and the third dielectric; a first side dielectric which has a first side ground in contact with the upper surface or lower surface thereof and is located on the first dielectric; and a second side dielectric which has a second side ground in contact with the upper surface or lower surface thereof and is located below the third dielectric, wherein in the second horizontal section, the first dielectric is separated from the first sub dielectric and the first side dielectric, and in the second horizontal section, the third dielectric is separated from the second sub dielectric and the second side dielectric.

In the second horizontal section, the second dielectric is separated from the first sub dielectric and the second sub dielectric.

A conductive paste or an EMI shield film is in contact with at least one of the top and the bottom of the second horizontal section.

The horizontal section is located so that a pair thereof is symmetrical to each other, and the vertical sections are located at both sides of the pair of horizontal sections, respectively.

In the pair of the horizontal sections, a gap based on the surrounding in which the position of the signal line is changed through each via hole is disposed in the wireless terminal to pass through the upper portion or lower portion of a battery.

In the pair of the horizontal sections, a gap based on the surrounding in which the position of the signal line is changed through each via hole is disposed in the wireless terminal to pass through the upper portion or lower portion of a battery.

The pair of horizontal sections is vertically folded so that the side surface faces the top to be disposed in the wireless terminal, and the lower portion of the pair of horizontal sections vertically folded is attached to a wall surface standing vertically inside the wireless terminal.

The pair of horizontal sections are vertically folded so that the side surface faces the top, and the position of the signal line located at the top is not changed through a via hole, and the pair of horizontal sections are vertically folded so that the side surface faces the top, so that the position of the signal line located at the bottom is changed through the via hole, so that the signal transmission length of the signal line located at the top and the signal transmission length of the signal line located at the bottom are adjusted to have the same length or a similar length.

Advantageous Effects

According to an embodiment of the present invention, in the flexible circuit board having the vertical section and the horizontal section, the vertical section and the horizontal section are formed so that the flexible circuit board may be easily disposed in a narrow space in a wireless terminal by an advantage of the vertical section and the radius of curvature, which is the gain of the horizontal section, is decreased so that the flexible circuit board is easily folded. Therefore, there is an appropriate effect on disposing the flexible circuit board in the wireless terminal in various environments.

DETAILED DESCRIPTION

Figure 1:
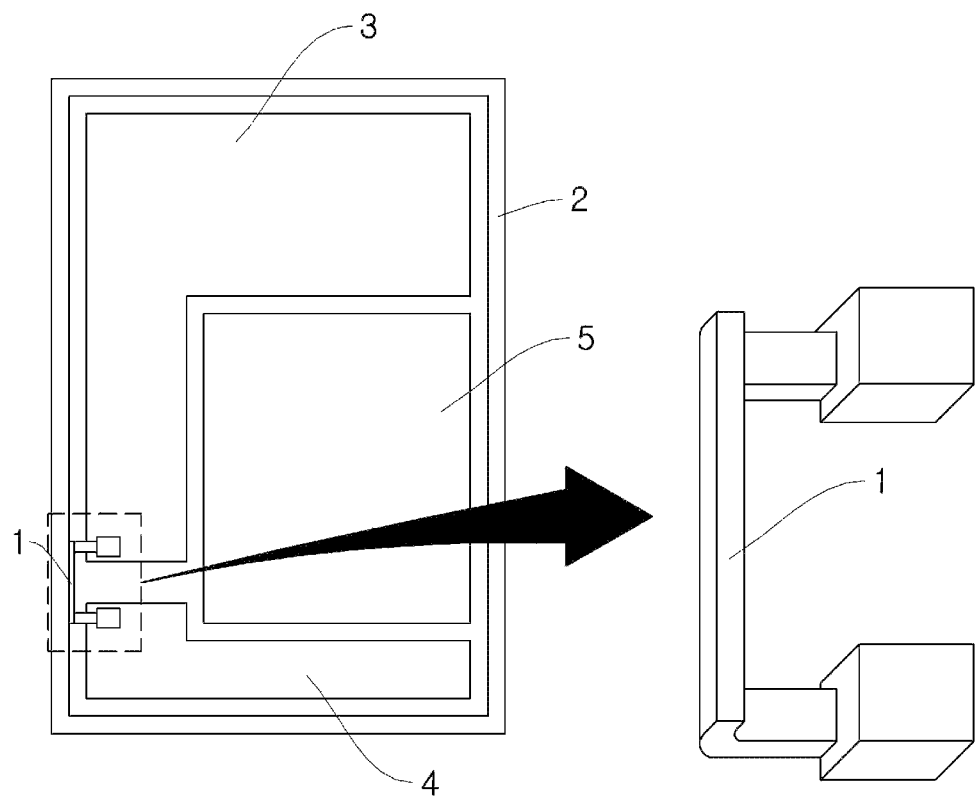
FIG. 1 is a diagram illustrating a form in which a conventional flexible circuit board is disposed in a wireless terminal.

As illustrated in FIG. 1, a flexible circuit board 1 including a signal line used for transmitting a high frequency signal between an antenna and an antenna element is disposed to be in surface contact with a housing 2 by folding a partial section to be disposed in a narrow space in a wireless terminal (e.g., a smartphone, a tablet, a notebook, etc.).

In the case of the flexible circuit board 1 including a plurality of signal lines for transmitting a plurality of high frequency signals, when the plurality of signal lines is disposed to be located on the same vertical line (e.g., an arrangement form of signal lines illustrated in FIG. 3), the radius of curvature increases, and thus the folding is difficult. Accordingly, in order to decrease the radius of curvature, the plurality of signal lines is disposed to be located on the same horizontal line (e.g., an arrangement form of signal lines illustrated in FIG. 5).

However, in the case of the flexible circuit board 1 in which the plurality of signal lines is disposed to be located on the same horizontal line, the width thereof is increased as compared to that of the flexible circuit board 1 in which the plurality of signal lines is disposed to be located on the same vertical line. Accordingly, due to the increased width, there is a problem that it is difficult to dispose the flexible circuit board 1 in a narrow space in the wireless terminal.

In an embodiment of the present invention to be described below, the flexible circuit board 1 including a first signal line 21, a second signal line 22, and a third signal line 23 will be mainly described, but is not limited thereto, and it should be understood that the flexible circuit board 1 including two or more signal lines is included in the description.

For example, the flexible circuit board 1 including two signal lines may be formed by excluding any one of the first signal line 21, the second signal line 22, and the third signal line 23.

Further, the flexible circuit board 1 including four or more signal lines may be formed so that signal lines and configurations related thereto are further located on the first signal line 21 or/and below the third signal line 23 in the same manner as that the first signal line 21 and the third signal line 23 are located on and below the second signal line 22, respectively.

Figure 2:
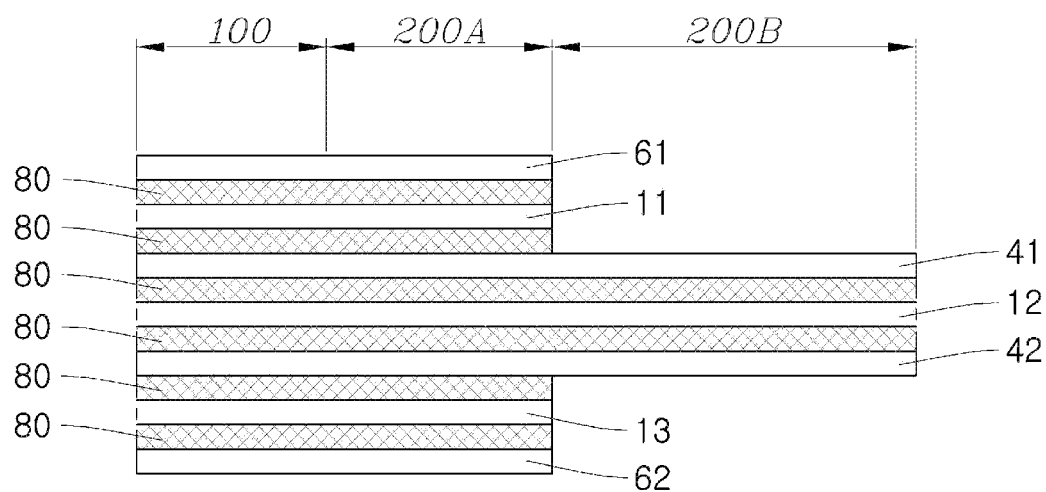
FIG. 2 is a diagram illustrating a side surface according to an embodiment of the present invention.
Figure 3:
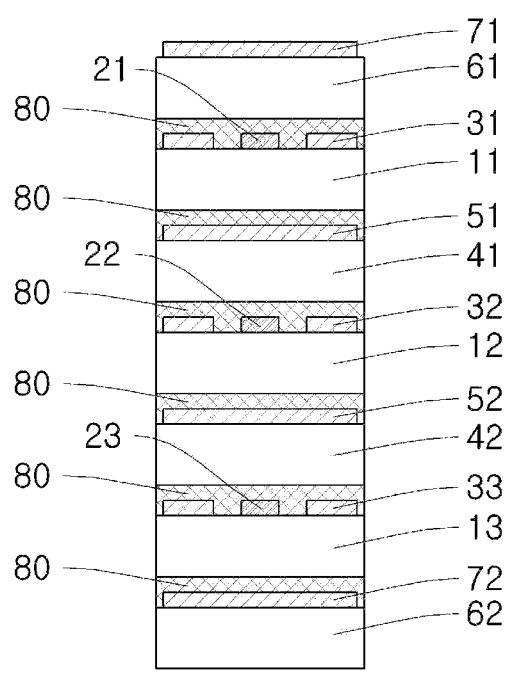
FIG. 3 is a diagram illustrating a cross section of a vertical section according to the embodiment of the present invention.
Figure 4:
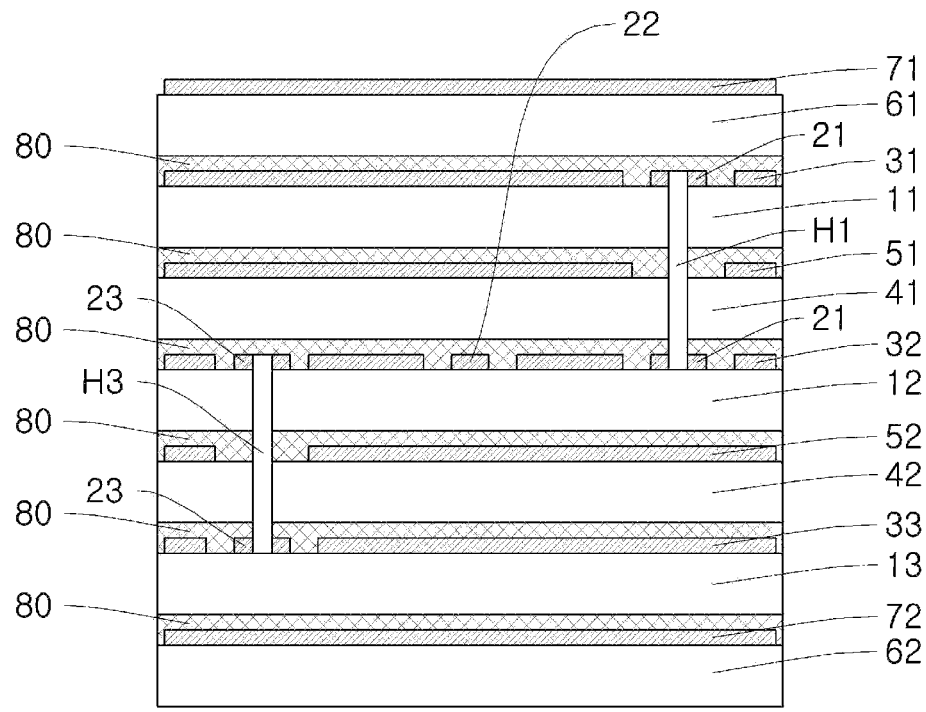
FIG. 4 is a diagram illustrating a cross section of a first horizontal section according to the embodiment of the present invention.
Figure 7:
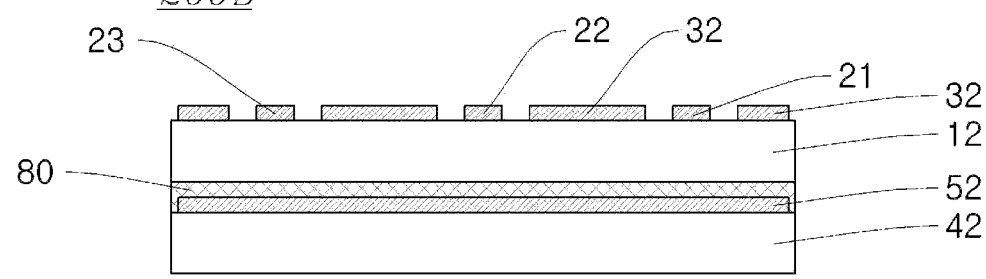
Figure 8:
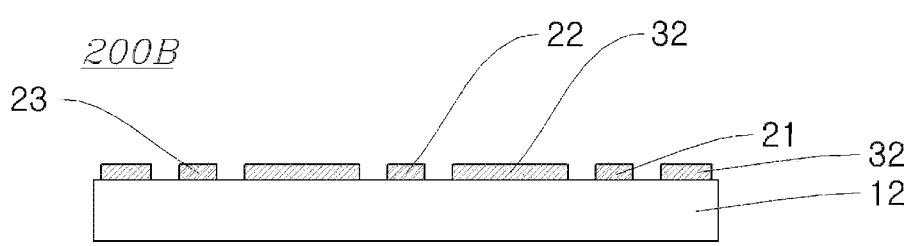
Figure 9:
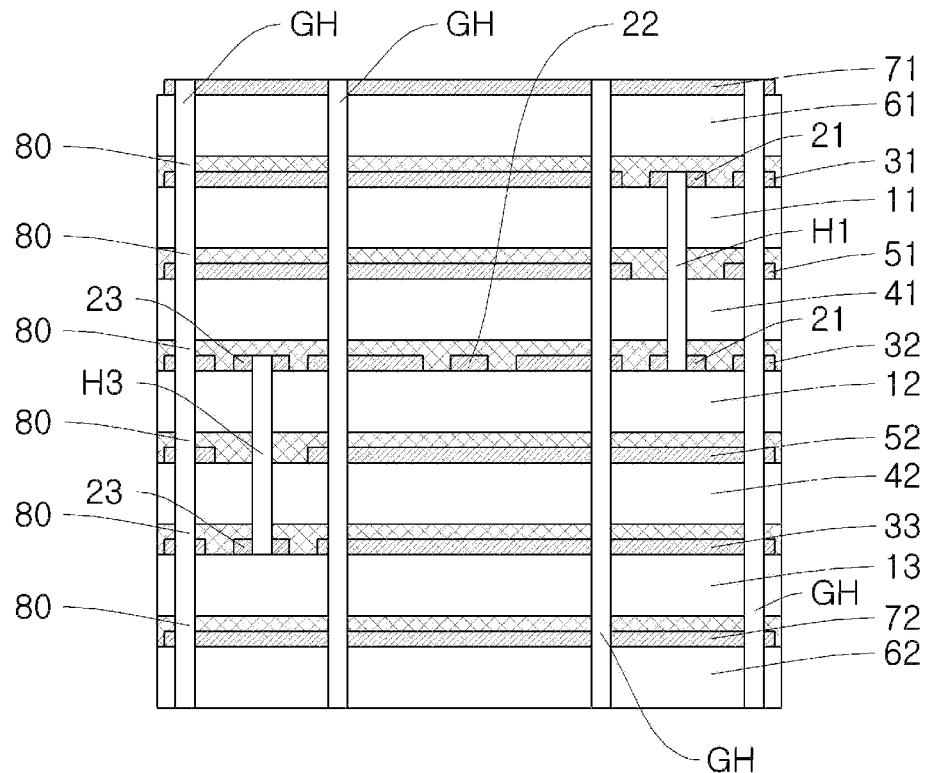
FIG. 9 is a diagram illustrating a cross section of a first horizontal section added with a ground via hole according to the embodiment of the present invention.
Figure 10:
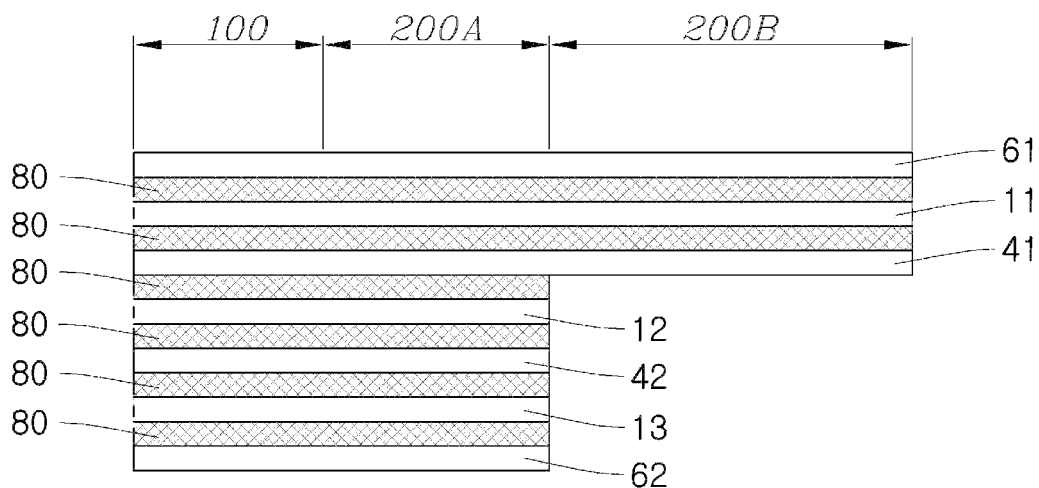
FIG. 10 is a diagram illustrating a side surface for showing another embodiment different from FIG. 2 according to the embodiment of the present invention.
Figure 11:
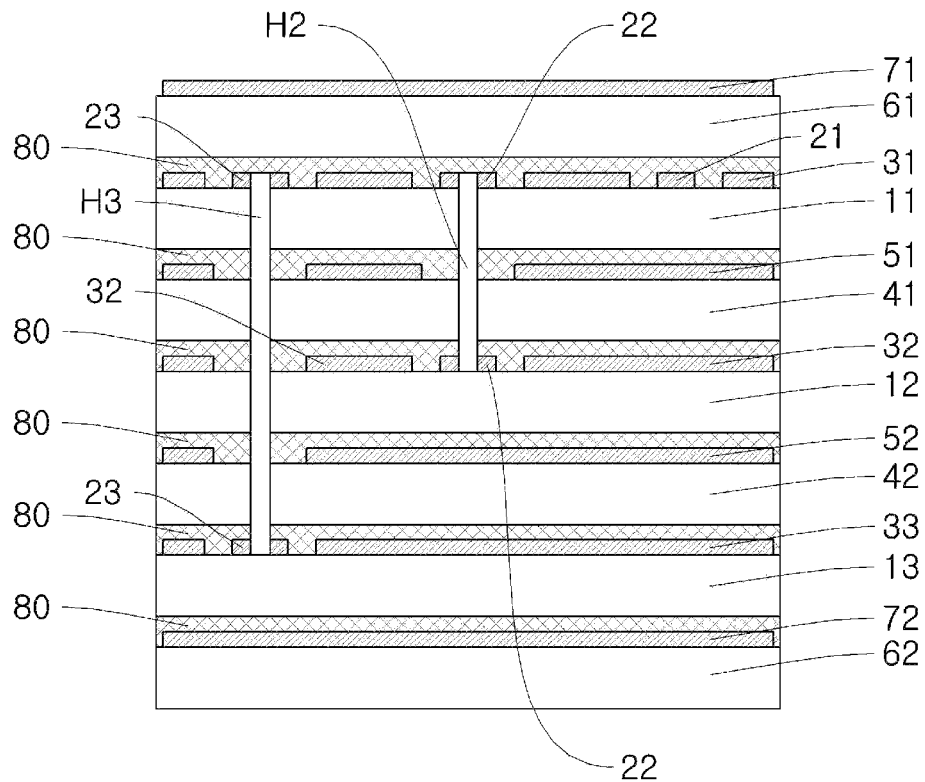
FIG. 11 is a diagram illustrating a cross section of a first horizontal section for showing another embodiment different from FIG. 4 according to the embodiment of the present invention.
Figure 12:
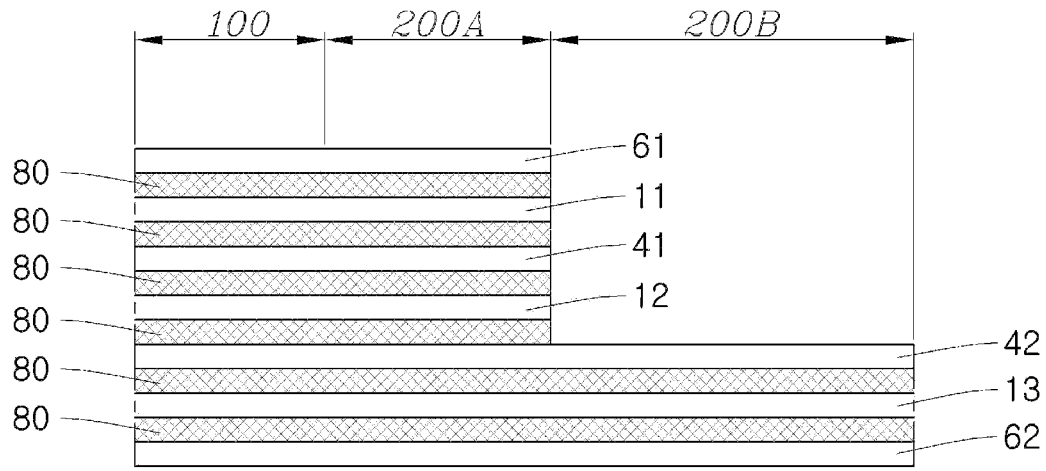
FIG. 12 is a diagram illustrating a side surface for showing another embodiment different from FIG. 2 according to the embodiment of the present invention.
Figure 13:
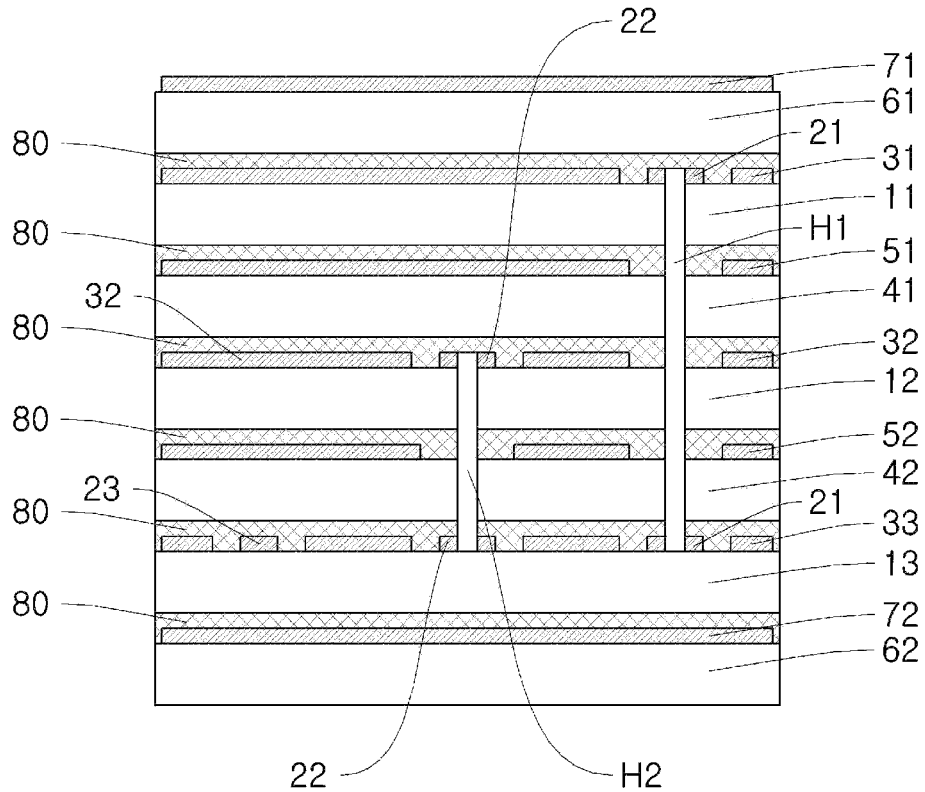
FIG. 13 is a diagram illustrating a cross section of a first horizontal section for showing another embodiment different from FIG. 4 according to the embodiment of the present invention.
Figure 14:
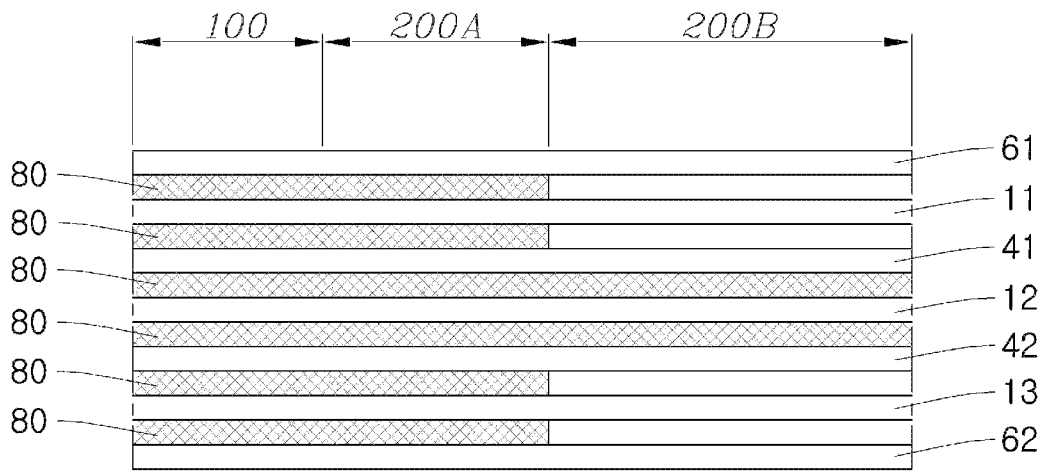
FIG. 14 is a diagram illustrating a side surface according to the embodiment of the present invention.
Figure 15A:
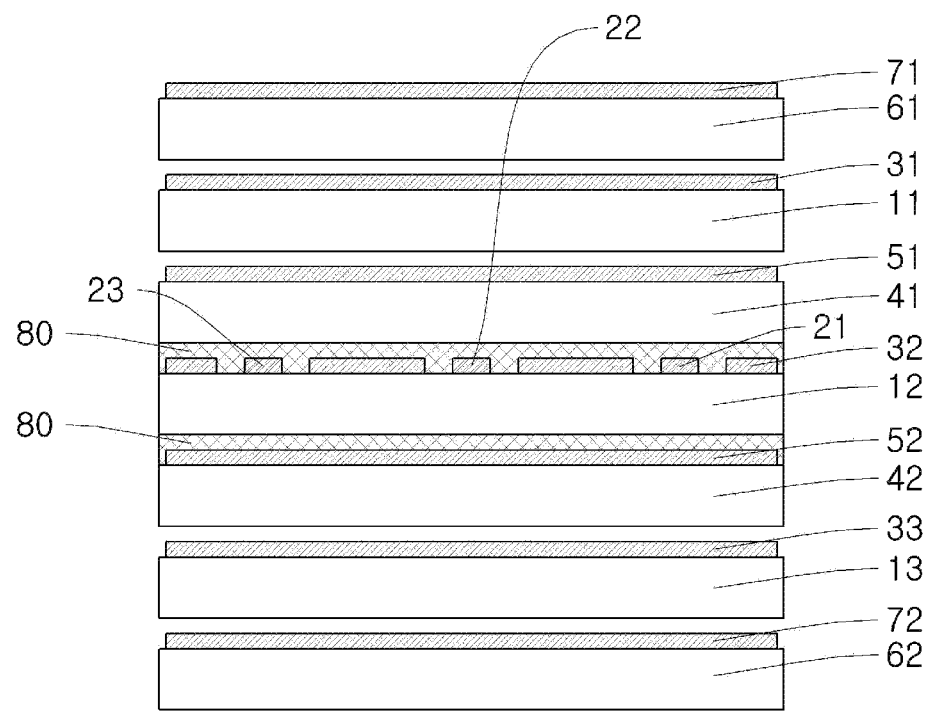
FIGS. 15A, 15B, and 15C are diagrams illustrating cross sections of a second horizontal section according to the embodiment of the present invention.
Figure 15B:
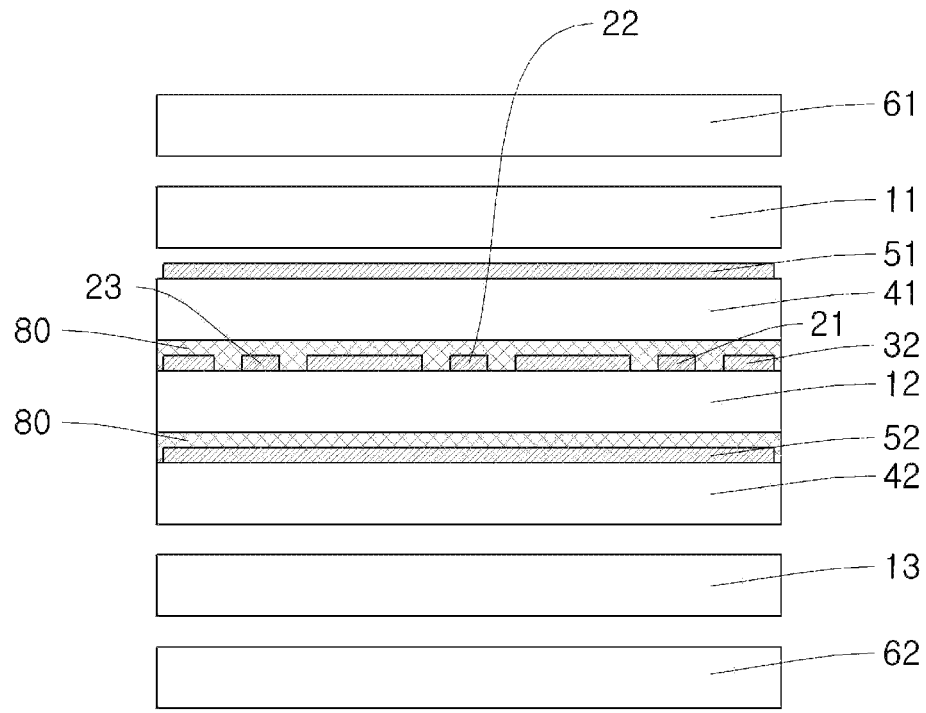
Figure 15C:
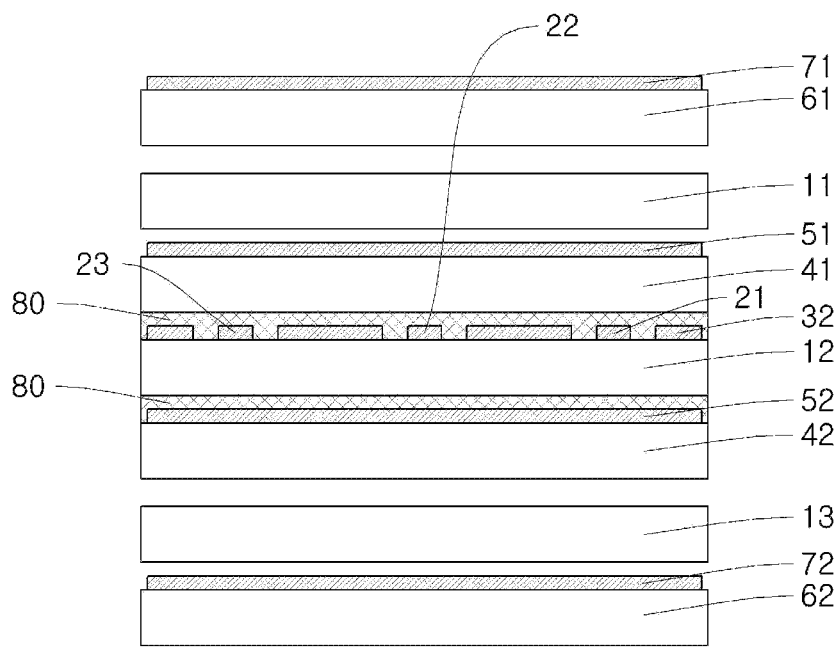
Figure 16:
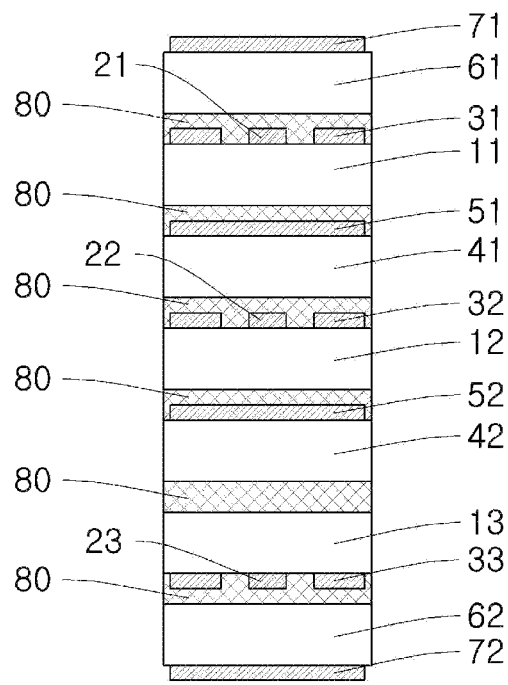
FIG. 16 is a diagram illustrating a cross section of a vertical section for showing another embodiment different from FIG. 3 according to the embodiment of the present invention.
Figure 17:
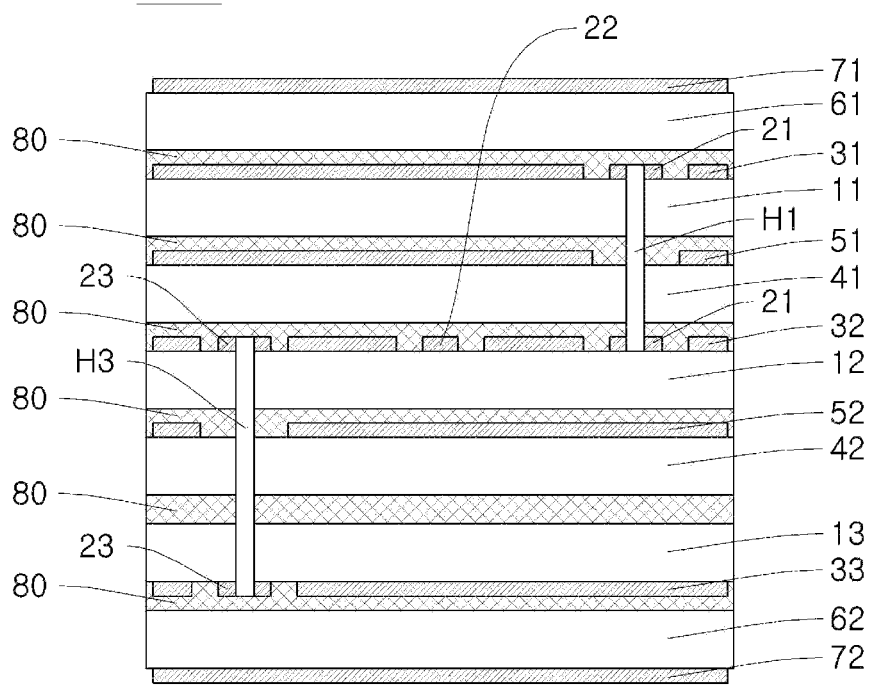
FIG. 17 is a diagram illustrating a cross section of a first horizontal section for showing another embodiment different from FIG. 4 according to the embodiment of the present invention.
Figure 18:
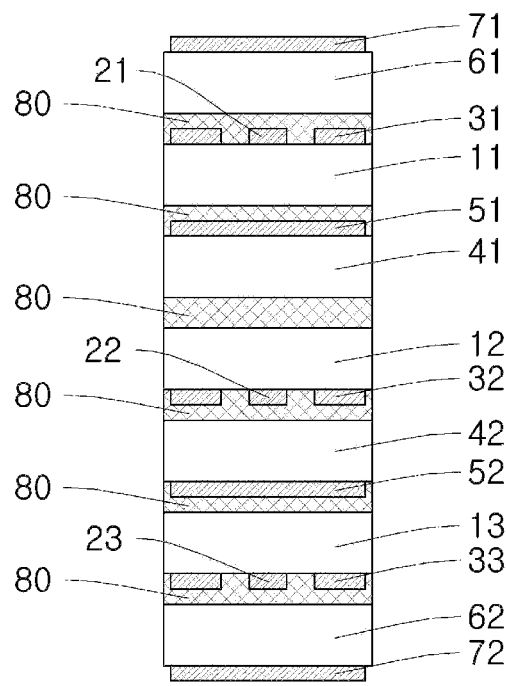
FIG. 18 is a diagram illustrating a cross section of a vertical section for showing another embodiment different from FIG. 3 according to the embodiment of the present invention.
Figure 19:
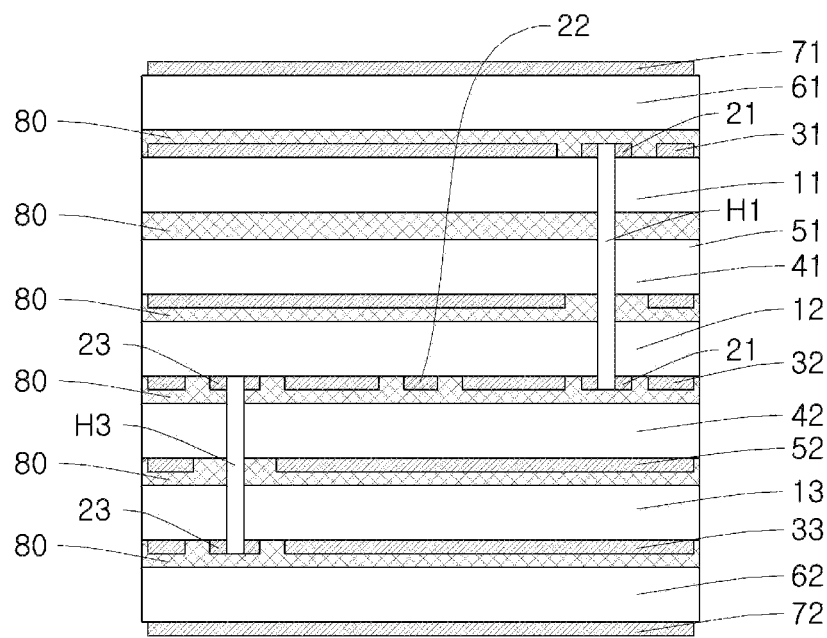
FIG. 19 is a diagram illustrating a cross section of a first horizontal section for showing another embodiment different from FIG. 4 according to the embodiment of the present invention.
Figure 20:
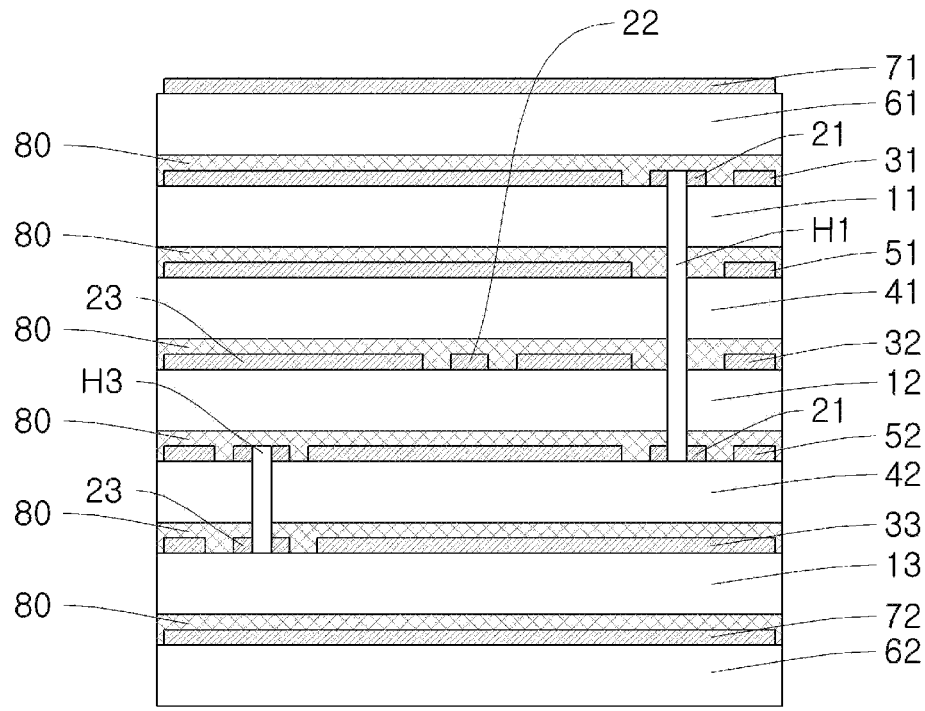
FIG. 20 is a diagram illustrating a cross section of a first horizontal section for showing another embodiment different from FIG. 4 according to the embodiment of the present invention.
Figure 21:
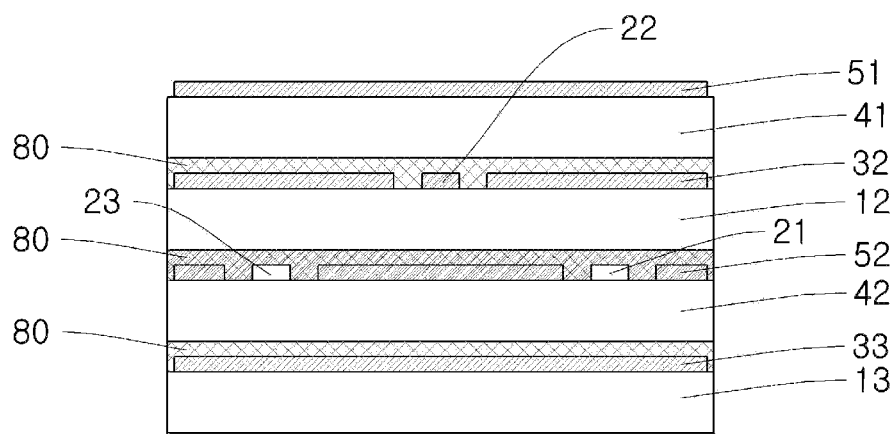
FIGS. 21 to 23 are diagrams illustrating cross sections of a second horizontal section for showing another embodiment different from FIGS. 5 to 8 according to the embodiment of the present invention.
Figure 22:
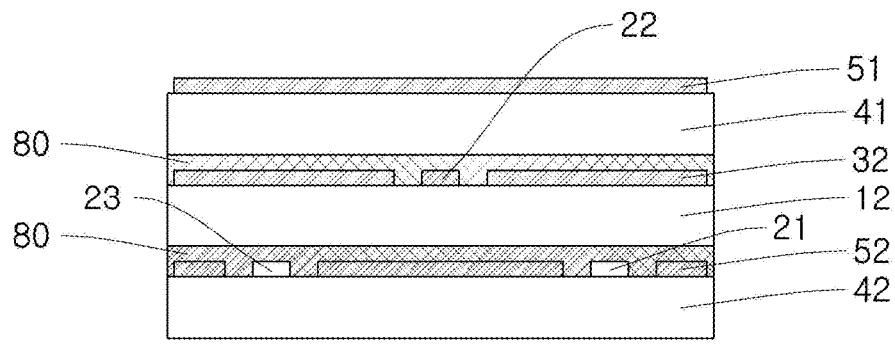
Figure 23:
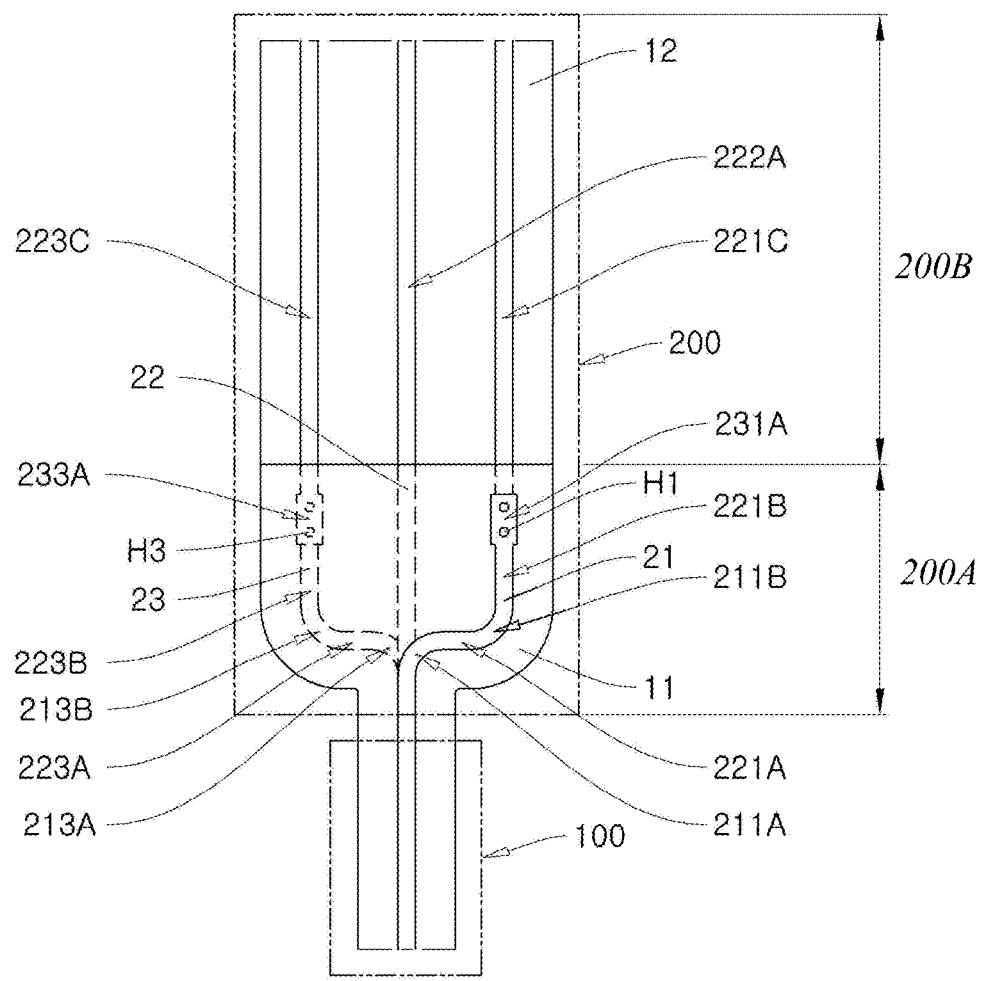
Figure 24:
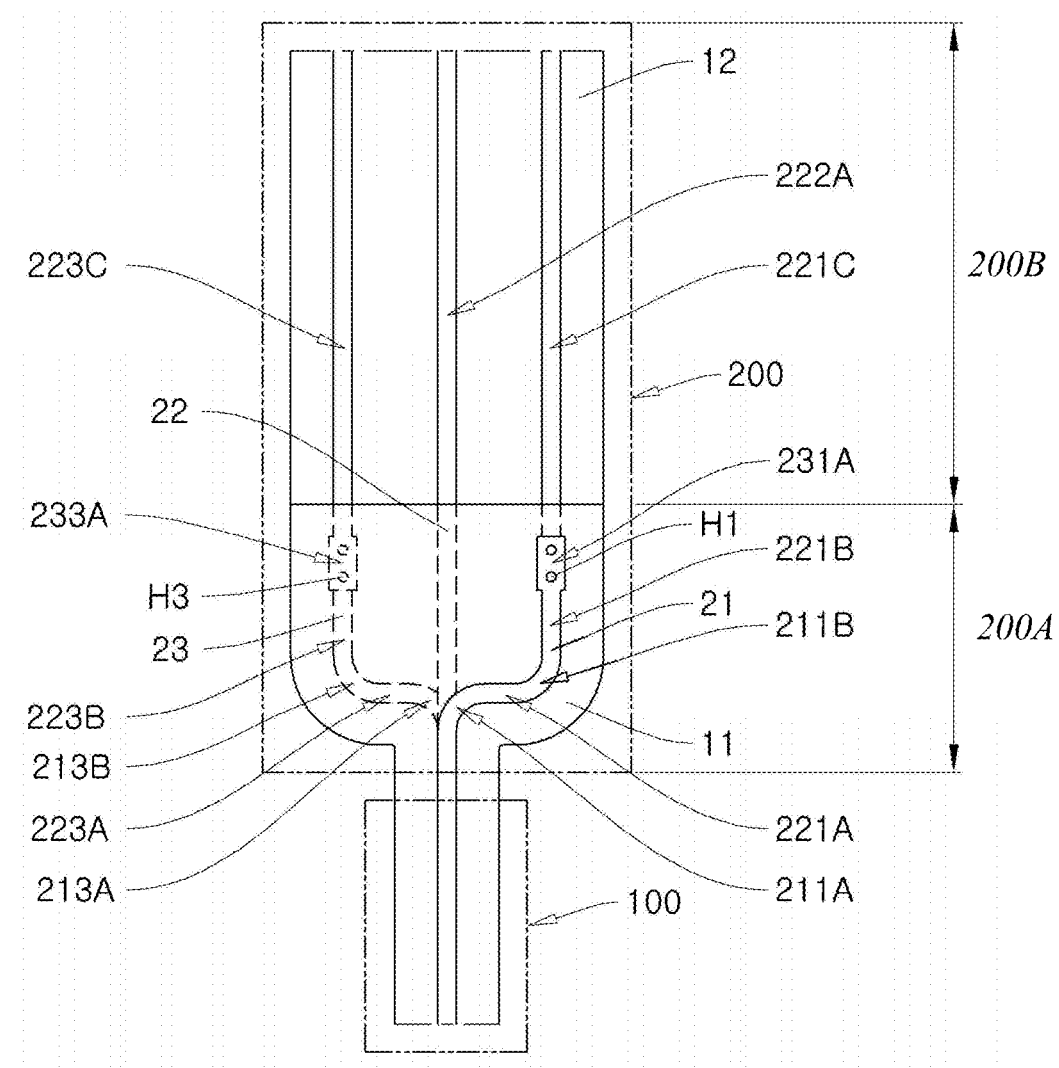
FIGS. 24 to 26 are diagrams illustrating a first embodiment which is divided according to the shape of an embodiment of the present invention.
Figure 25:
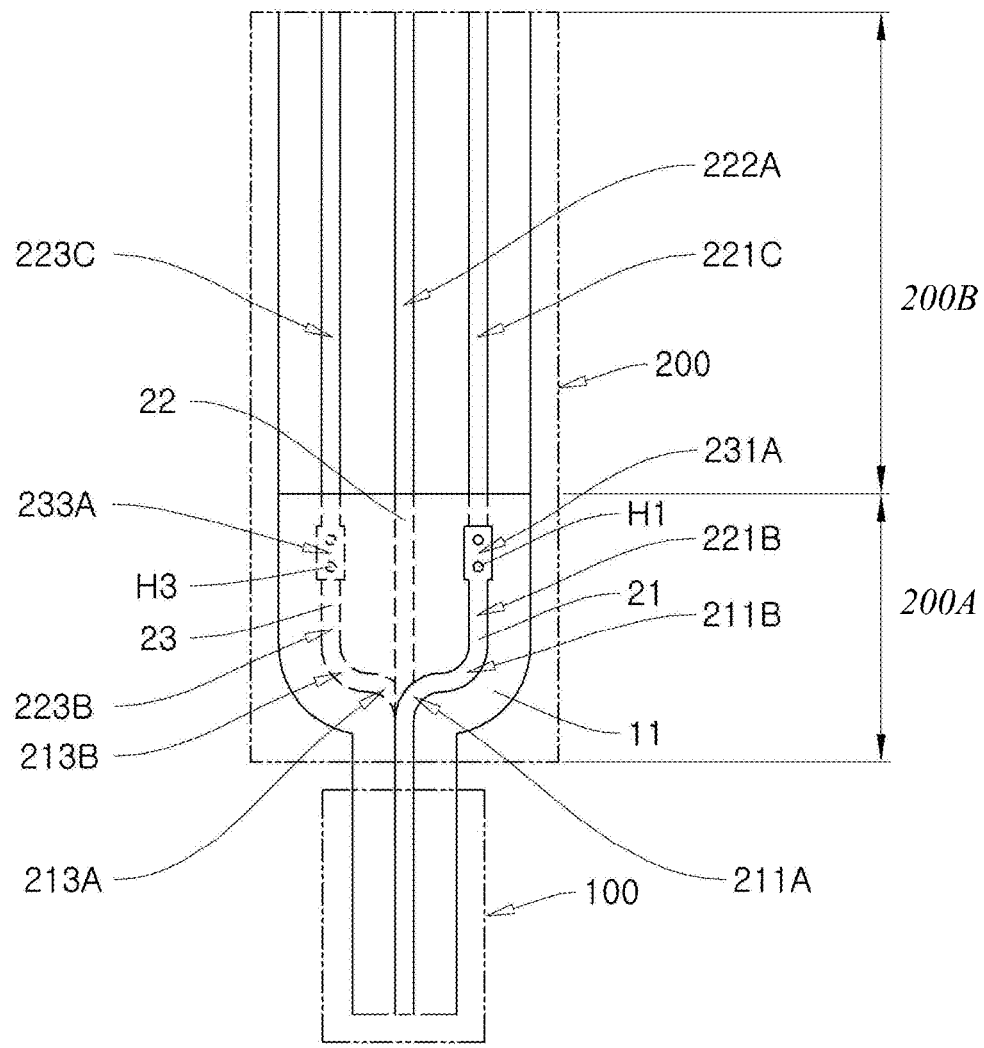
Figure 26:
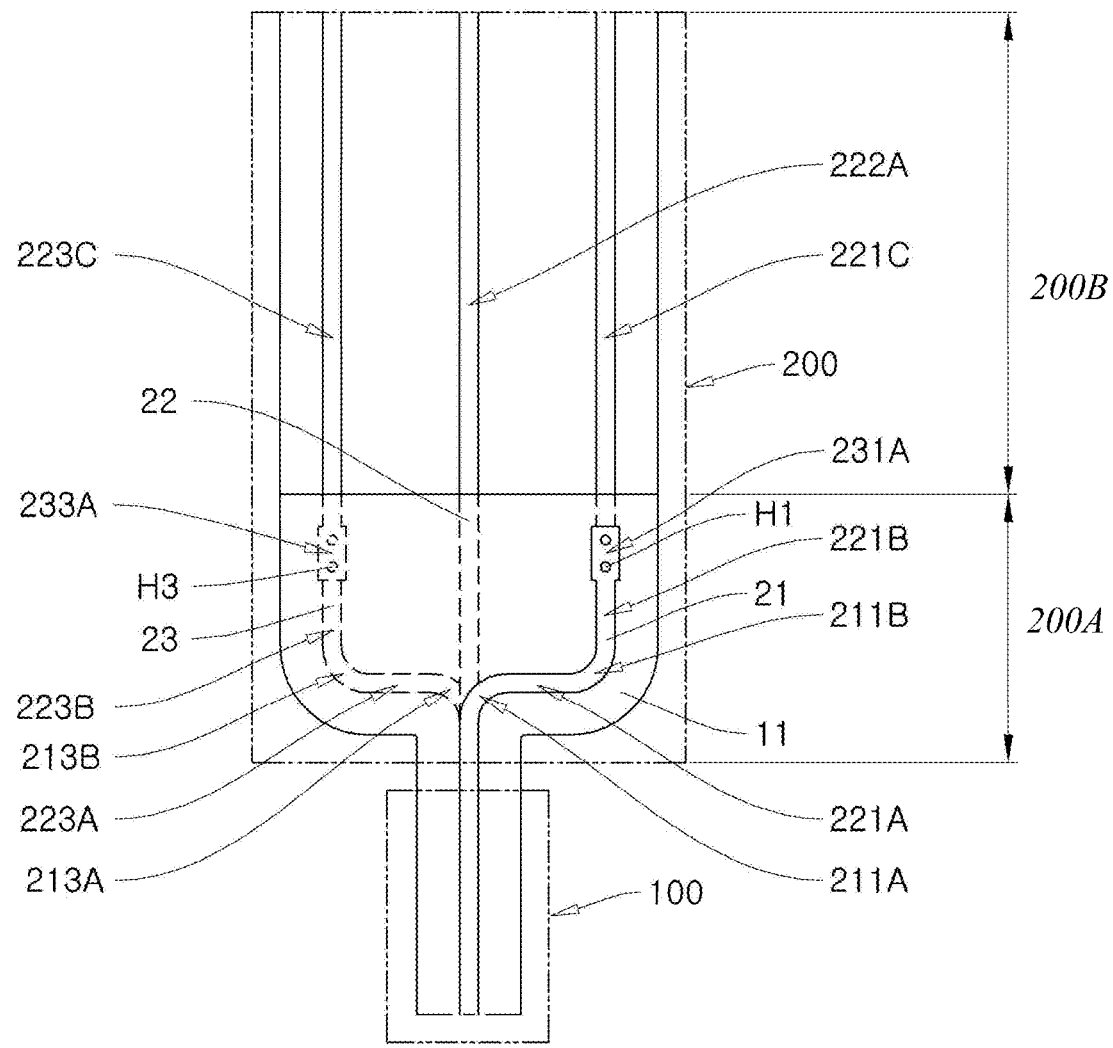
Figure 39:
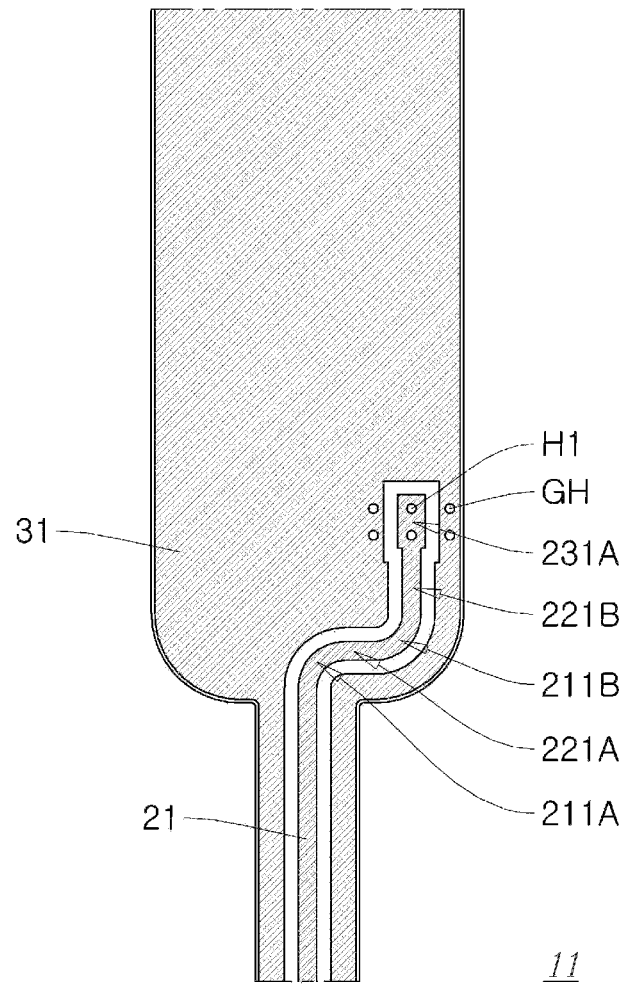
Figure 40:
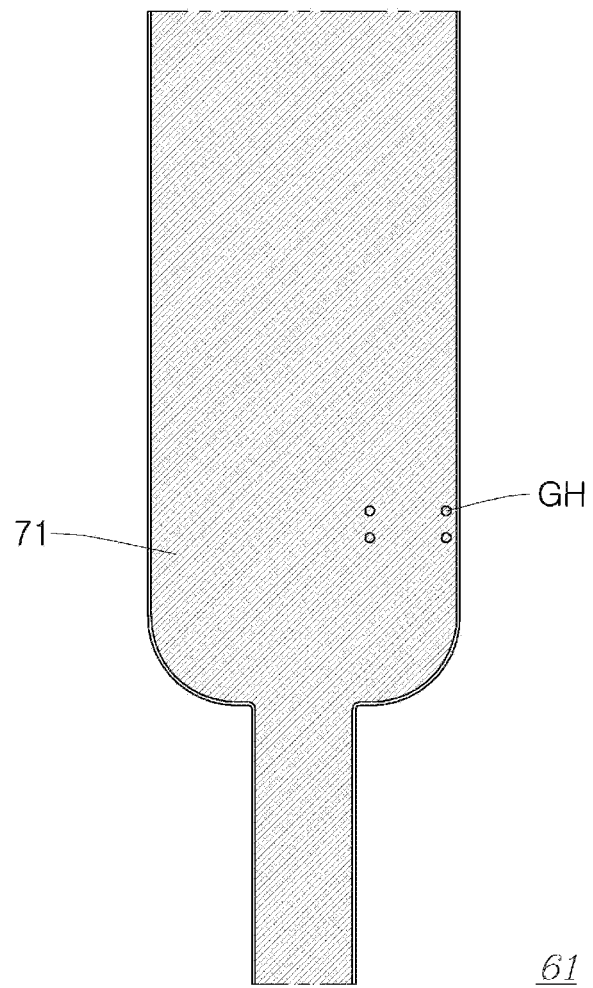
Figure 41:
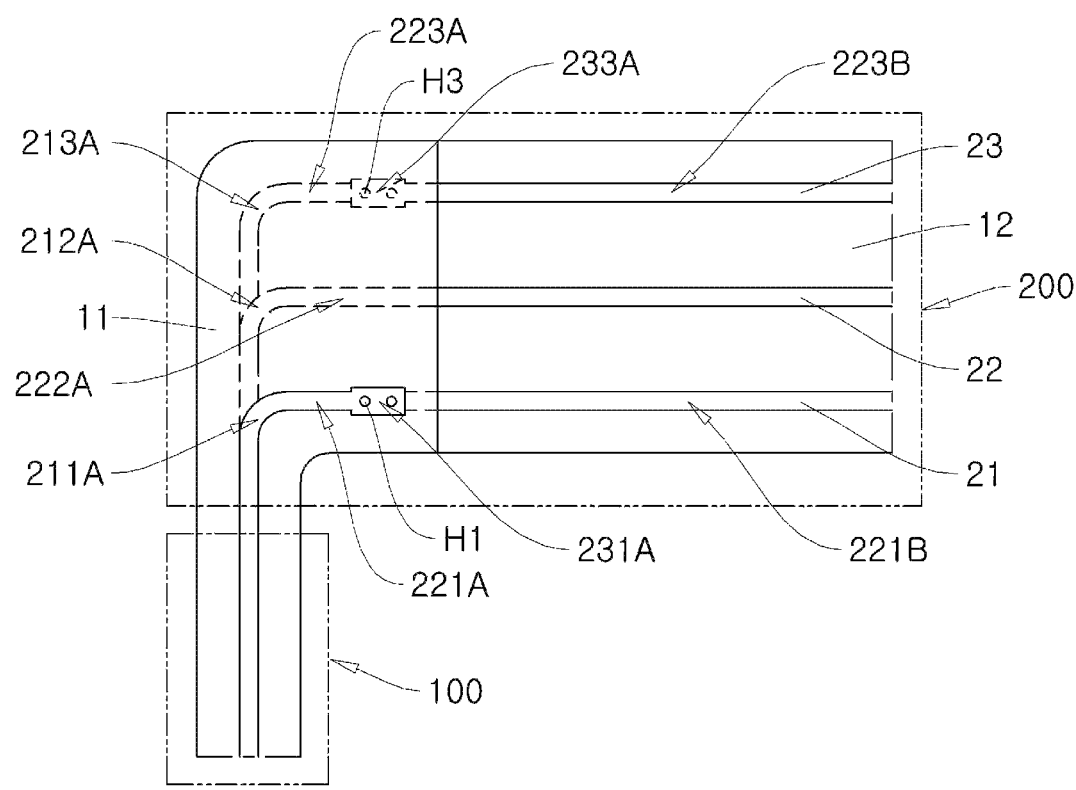
FIG. 41 is a diagram illustrating a second embodiment which is divided according to the shape of an embodiment of the present invention.
Figure 42:
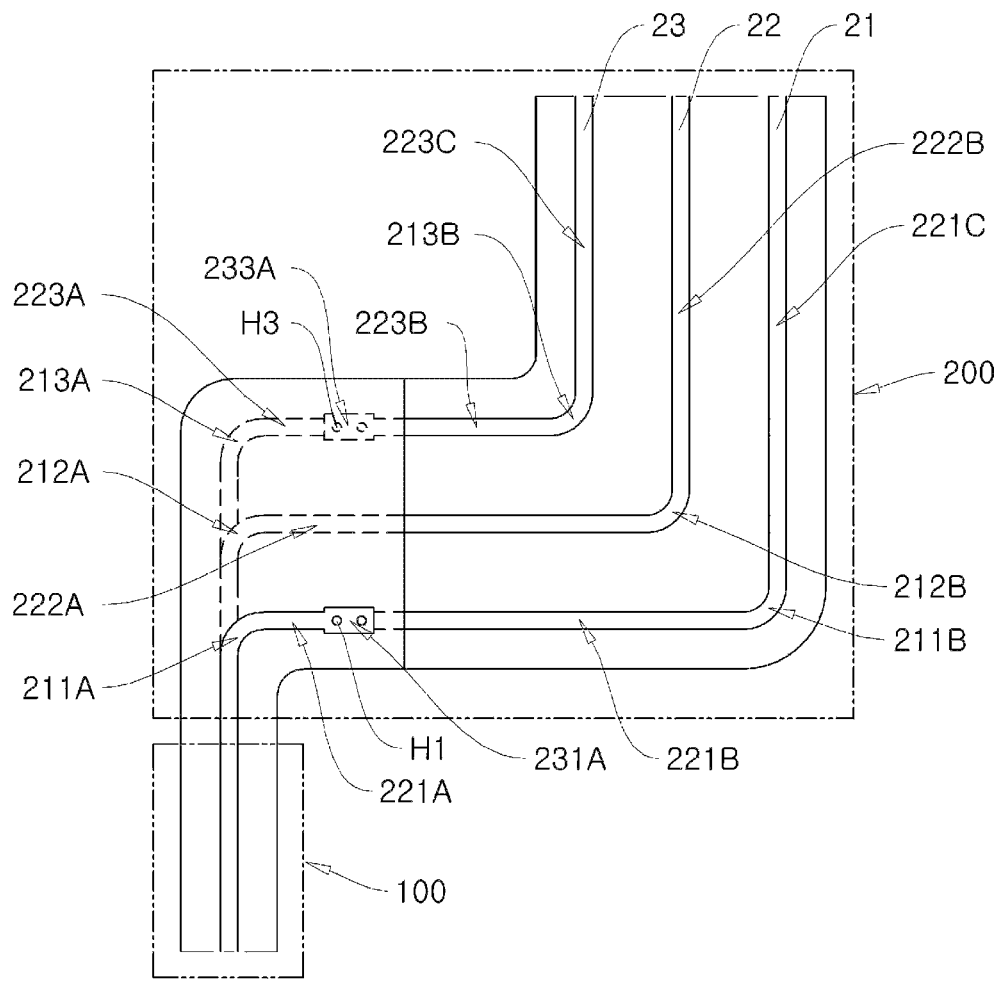
FIG. 42 is a diagram illustrating a third embodiment which is divided according to the shape of an embodiment of the present invention.
Figure 43A:
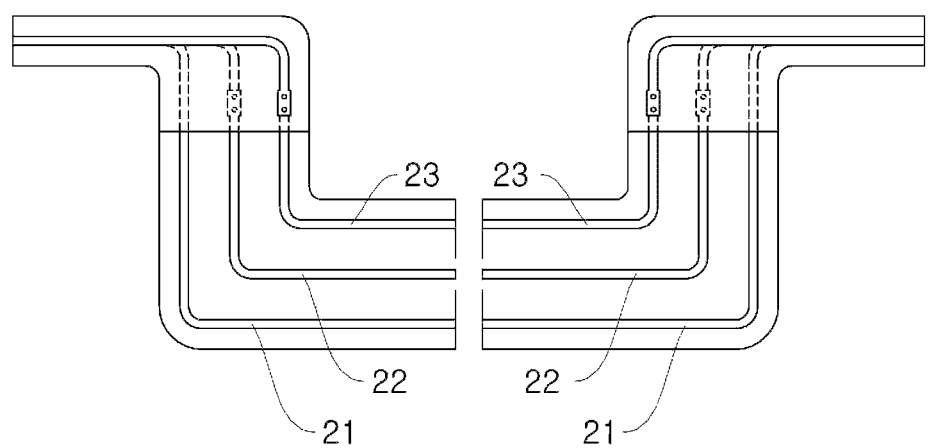
FIGS. 43A and 43B are diagrams illustrating application forms according to an embodiment of the present invention.
Figure 43B:
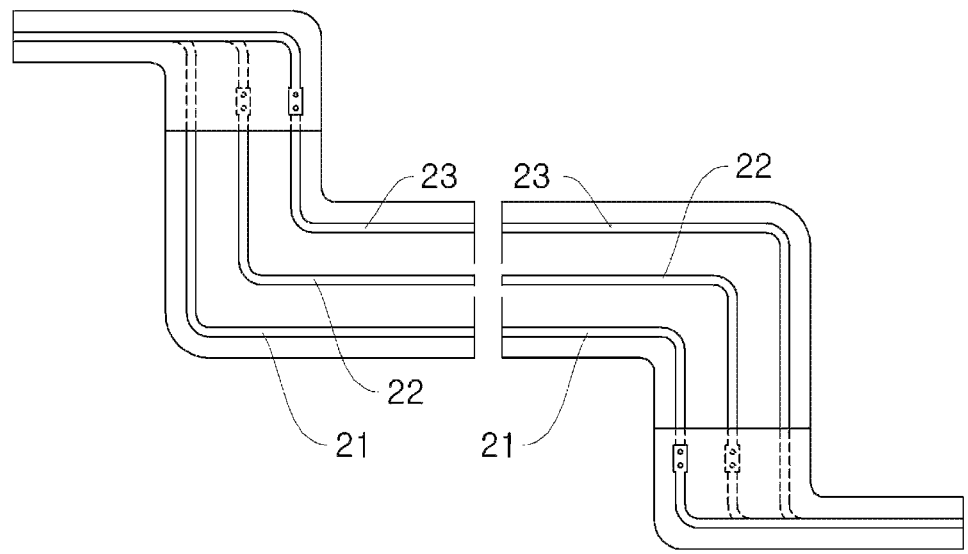
Figure 44:
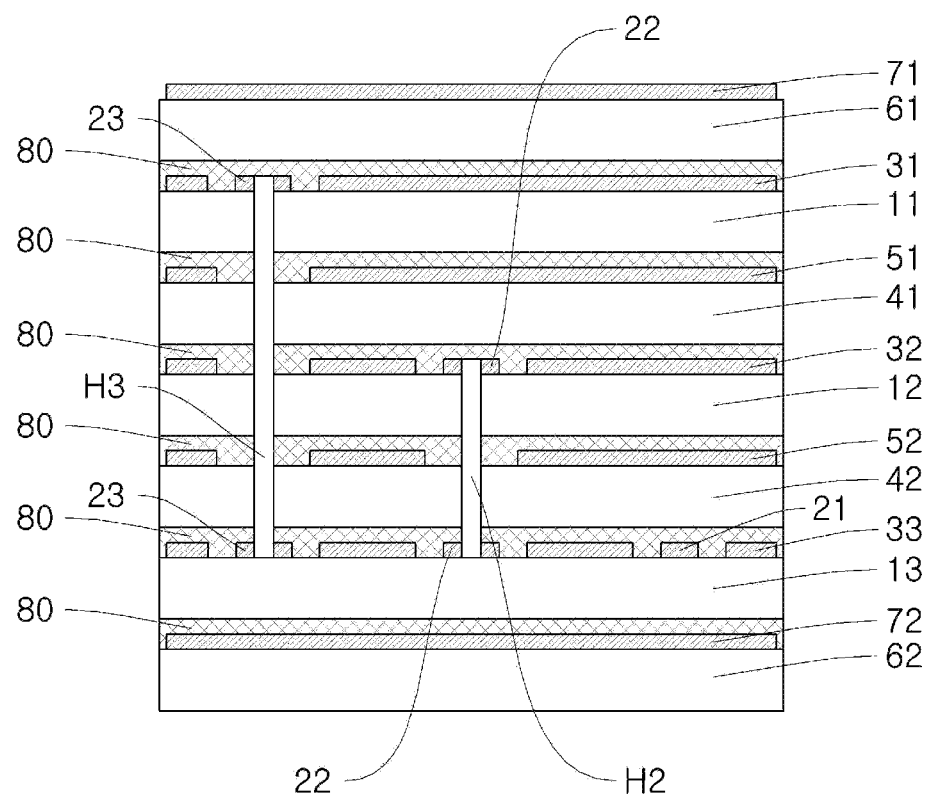
FIGS. 44 and 45 are diagrams illustrating cross sections of both sides of a first horizontal section of FIG. 43A according to an embodiment of the present invention.
Figure 45:
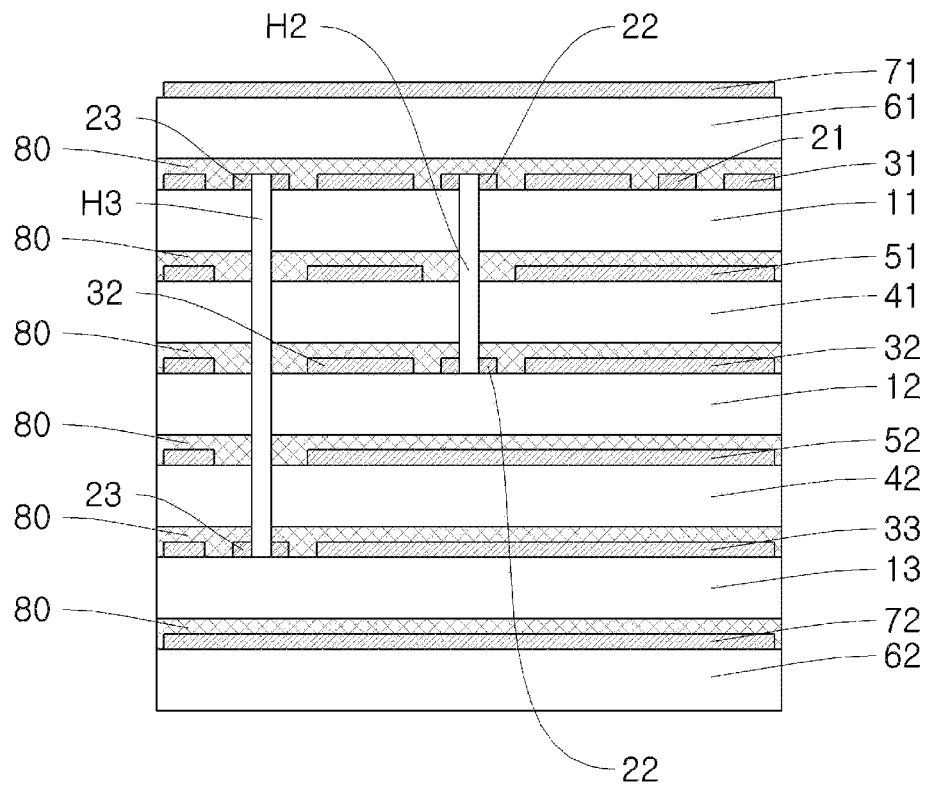
Figure 46:
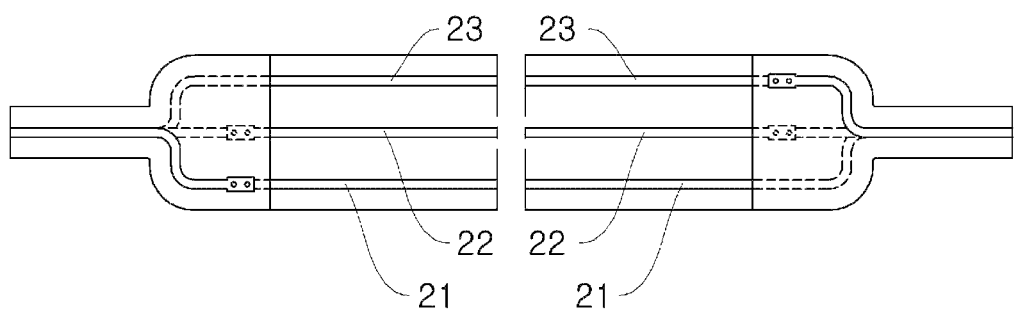
FIG. 46 is a diagram illustrating an application form according to an embodiment of the present invention.
Figure 47:
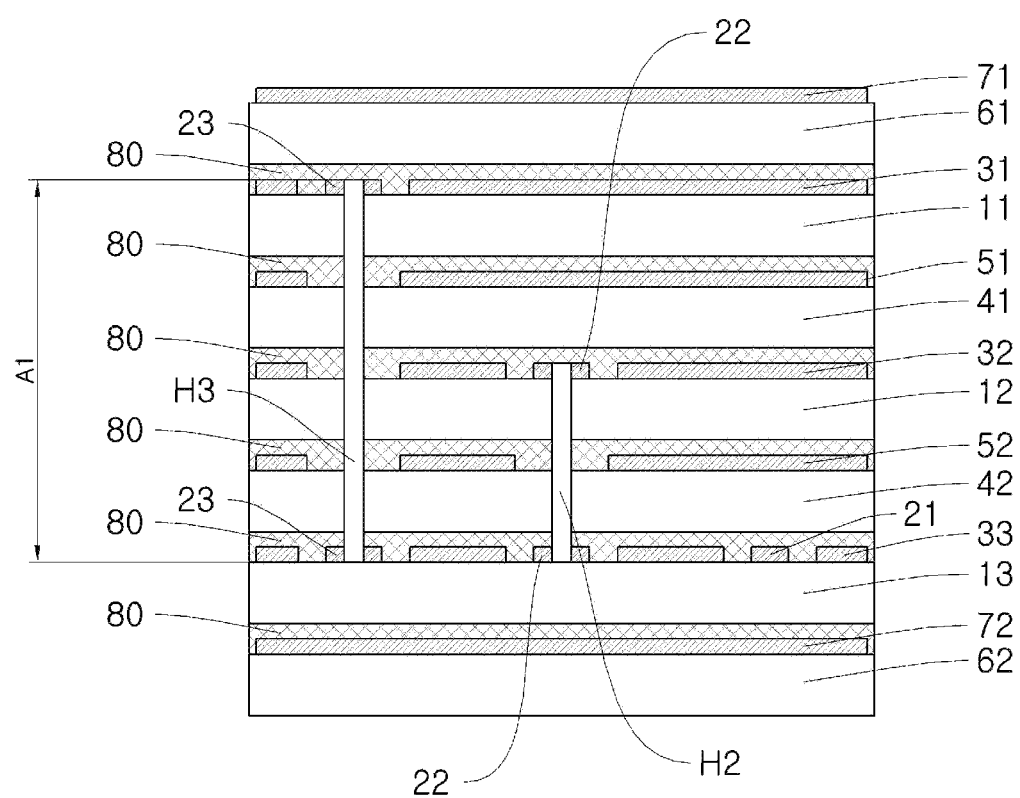
FIGS. 47 and 48 are diagrams illustrating cross sections of both sides of a first horizontal section of FIGS. 43B and 46 according to an embodiment of the present invention.
Figure 48:
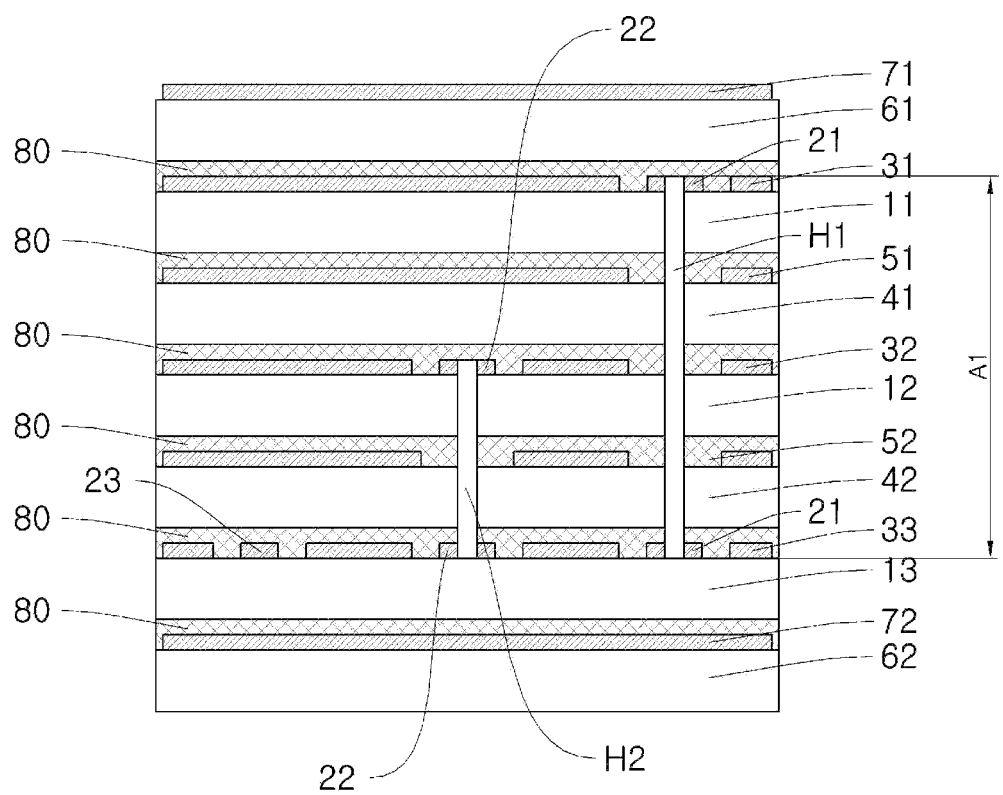
Figure 49:
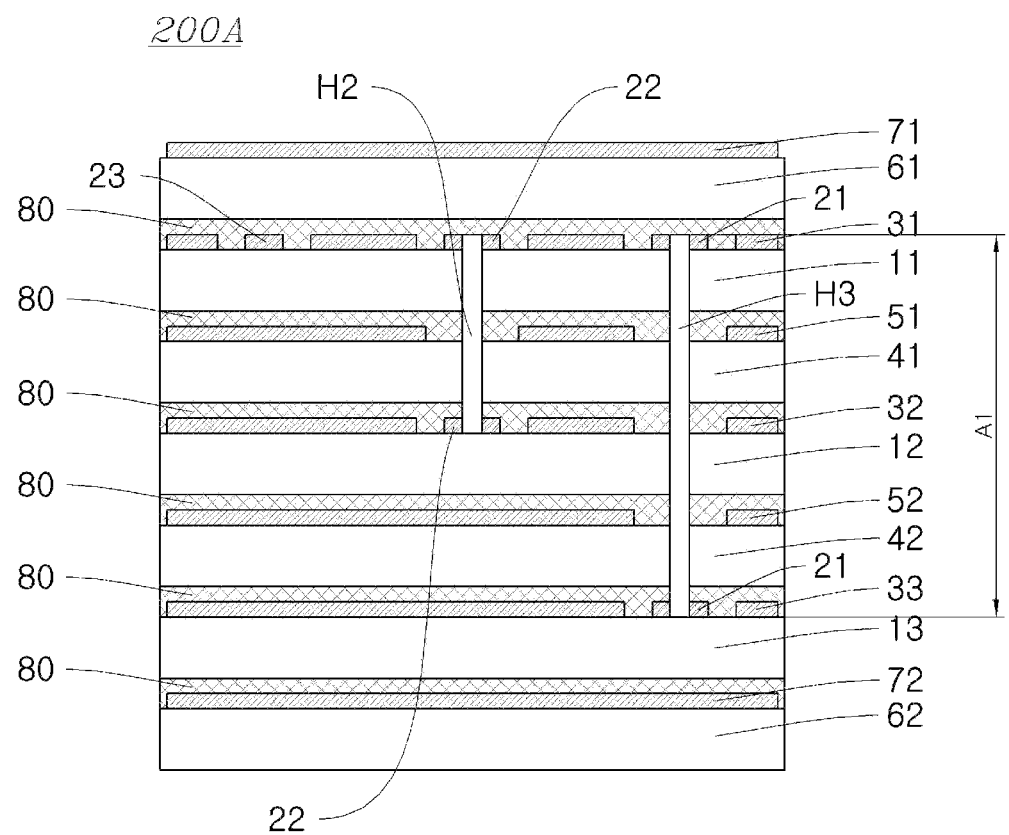
FIGS. 49 to 50 are diagrams illustrating cross sections of both sides of a first horizontal section for showing another embodiment different from FIGS. 47 to 48 according to the embodiment of the present invention.
Figure 50:
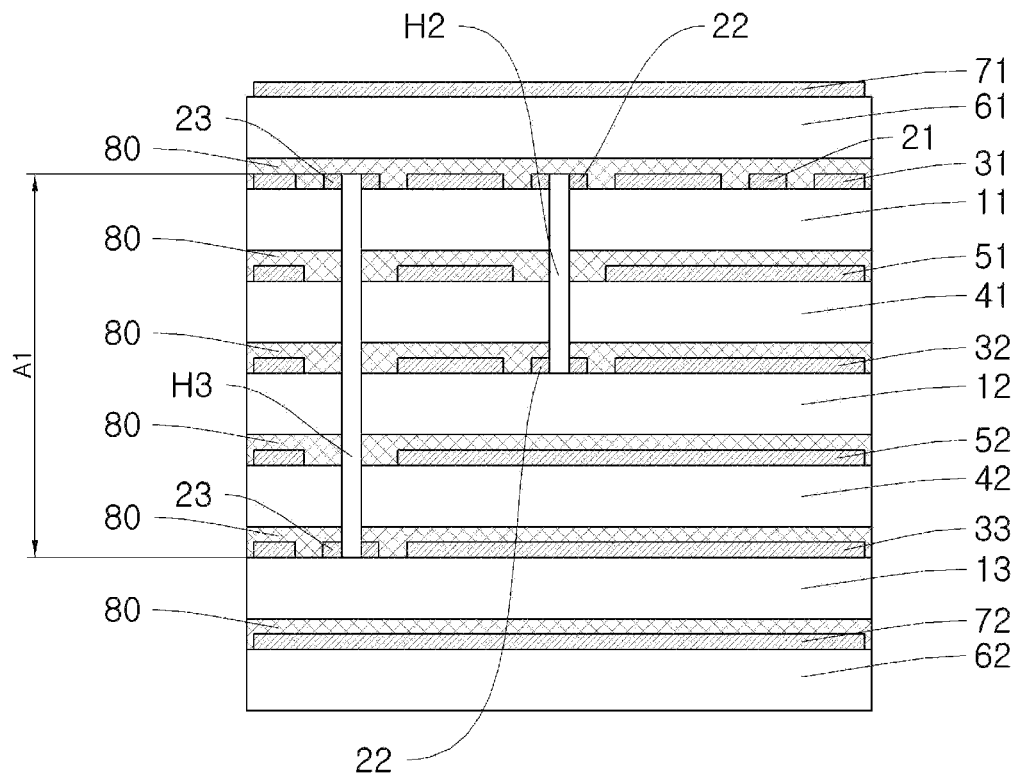

The drawings will be briefly described:

FIG. 2 is a diagram illustrating a side surface according to the embodiment of the present invention, FIG. 3 is a diagram illustrating a cross section of a vertical section 100 according to an embodiment of the present invention, FIG. 4 is a diagram illustrating a cross section of a first horizontal section 200A according to the embodiment of the present invention, FIGS. 5 to 8 are diagrams illustrating cross sections of a second horizontal section 200B according to the embodiment of the present invention, FIG. 9 is a diagram illustrating a cross section of a first horizontal section 200A added with a ground via hole GH according to the embodiment of the present invention, FIG. 10 is a diagram illustrating a side surface for showing another embodiment different from FIG. 2 according to the embodiment of the present invention, FIG. 11 is a diagram illustrating a cross section of a first horizontal section 200A for showing another embodiment different from FIG. 4 according to the embodiment of the present invention, FIG. 12 is a diagram illustrating a side surface for showing another embodiment different from FIG. 2 according to the embodiment of the present invention, FIG. 13 is a diagram illustrating a cross section of a first horizontal section 200A for showing another embodiment different from FIG. 4 according to the embodiment of the present invention, FIG. 14 is a diagram illustrating a side surface according to the embodiment of the present invention, FIGS. 15A, 15B, and 15C are diagrams illustrating cross sections of a second horizontal section 200B according to the embodiment of the present invention, FIG. 16 is a diagram illustrating a cross section of a vertical section 100 for showing another embodiment different from FIG. 3 according to the embodiment of the present invention, FIG. 17 is a diagram illustrating a cross section of a first horizontal section 200A for showing another embodiment different from FIG. 4 according to the embodiment of the present invention, FIG. 18 is a diagram illustrating a cross section of a vertical section 100 for showing another embodiment different from FIG. 3 according to the embodiment of the present invention, FIG. 19 is a diagram illustrating a cross section of a first horizontal section 200A for showing another embodiment different from FIG. 4 according to the embodiment of the present invention, FIG. 20 is a diagram illustrating a cross section of a first horizontal section 200A for showing another embodiment different from FIG. 4 according to the embodiment of the present invention, FIGS. 21 to 23 are diagrams illustrating cross sections of a second horizontal section 200B for showing another embodiment different from FIGS. 5 to 8 according to the embodiment of the present invention, FIGS. 24 to 26 are diagrams illustrating a first embodiment which is divided according to the shape of an embodiment of the present invention, FIGS. 27 to 34 are diagrams illustrating sequentially a lamination structure of FIG. 2 according to the embodiment of the present invention, FIGS. 35 to 40 are diagrams sequentially illustrating a lamination structure of FIG. 14 according to the embodiment of the present invention, FIG. 41 is a diagram illustrating a second embodiment which is divided according to the shape of an embodiment of the present invention, FIG. 42 is a diagram illustrating a third embodiment which is divided according to the shape of an embodiment of the present invention, FIGS. 43A and 43B are diagrams illustrating application forms according to an embodiment of the present invention, FIGS. 44 and 45 are diagrams illustrating cross sections of both sides of a first horizontal section 200A of FIG. 43A according to an embodiment of the present invention, FIG. 46 is a diagram illustrating an application form according to an embodiment of the present invention, FIGS. 47 and 48 are diagrams illustrating cross sections of both sides of a first horizontal section 200A of FIGS. 43B and 46 according to an embodiment of the present invention, FIGS. 49 to 50 are diagrams illustrating cross sections of both sides of a first horizontal section 200A for showing another embodiment different from FIGS. 47 to 48 according to the embodiment of the present invention, and FIGS. 51 to 56 are diagrams illustrating examples of application to a wireless terminal of an embodiment of the present invention.

First, the gist of the flexible circuit board 1 including two signal lines will be described.

In the drawings, although the flexible circuit board 1 including two signal lines is not illustrated separately, the flexible circuit board 1 including two signal lines may be sufficiently derived by excluding the first signal line 21 or the third signal line 23 and configurations related thereto from the flexible circuit board 1 including three signal lines.

The flexible circuit board 1 having a vertical section 100 and a horizontal section 200 according to the embodiment of the present invention, as illustrated in FIGS. 2 to 8, includes a first dielectric 11, a second dielectric 12, a vertical section 100, and a horizontal section 200.

The first dielectric 11 has the first signal line 21 in contact with an upper surface or lower surface thereof, has a greater width than the first signal line 21 and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The vertical section 100 is a section in which the first signal line 21 and the second signal line 22 are located on the same vertical line and the first signal line 21 and the second signal line 22 extend in parallel.

The horizontal section 200 is a section in which the position of the first signal line 21 or the second signal line 22 is changed through a via hole and the first signal line 21 and the second signal line 22 are located on the same horizontal line.

For example, as illustrated in FIG. 4, in the horizontal section 200, the position of the first signal line 21 is changed to the upper surface or lower surface of the second dielectric 12 by a first via hole H1 to be located on the same horizontal line as the second signal line 22.

Next, the gist of the flexible circuit board 1 including three signal lines will be described.

In the drawings, although the flexible circuit board 1 including four or more signal lines is not illustrated separately, the flexible circuit board 1 including four or more signal lines may be sufficiently derived by adding signal lines and configurations related thereto to the flexible circuit board 1 including three signal lines.

The flexible circuit board 1 having a vertical section 100 and a horizontal section 200 according to the embodiment of the present invention, as illustrated in FIGS. 2 to 8, includes a first dielectric 11, a second dielectric 12, a third dielectric 13, a vertical section 100, and a horizontal section 200.

The first dielectric 11 has the first signal line 21 in contact with an upper surface or lower surface thereof, has a greater width than the first signal line 21, and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The third dielectric 13 is located below the second dielectric 12, has the third signal line 23 in contact with the upper or lower surface thereof, has a greater width than the third signal line 23, and extends along an extension direction of the third signal line 23.

The vertical section 100 is a section in which the first signal line 21, the second signal line 22, and the third signal line 23 are located on the same vertical line and the first signal line 21, the second signal line 22, and the third signal line 23 extend in parallel.

The horizontal section 200 is a section in which the positions of two or more of the first signal line 21, the second signal line 22, and the third signal line 23 are changed through a via hole, and then the first signal line 21, the second signal line 22, and the third signal line 23 are located on the same horizontal line.

For example, as illustrated in FIG. 4, in the horizontal section 200, the positions of the first signal line 21 and the third signal line 23 are changed to the upper surface or lower surface of the second dielectric 12 by the first via hole H1 and a third via hole H3 to be located on the same horizontal line as the second signal line 22. That is, in the horizontal section 200, the positions of two or more signal lines are changed through the via holes, so that the first signal line 21, the second signal line 22, and the third signal line 23 may be located on the upper surface or lower surface of the second dielectric 12.

Further, as illustrated in FIG. 11, in the horizontal section 200, the positions of the second signal line 22 and the third signal line 23 are changed to the upper surface or lower surface of the first dielectric 11 by the second via hole H2 and the third via hole H3 to be located in the same manner as the first signal line 21. That is, in the horizontal section 200, the positions of two or more signal lines are changed through the via holes, so that the first signal line 21, the second signal line 22, and the third signal line 23 may be located on the upper surface or lower surface of the first dielectric 11.

Further, as illustrated in FIG. 13, in the horizontal section 200, the positions of the first signal line 21 and the second signal line 22 are changed to the upper surface or lower surface of the third dielectric 13 by the first via hole H1 and the second via hole H2 to be located in the same manner as the third signal line 23. That is, in the horizontal section 200, the positions of two or more signal lines are changed through the via holes, so that the first signal line 21, the second signal line 22, and the third signal line 23 may be located on the upper surface or lower surface of the third dielectric 13.

In addition, the flexible circuit board 1 including four or more signal lines may include four or more signal lines by further adding signal lines and configurations related thereto on the first signal line 21 or/and below the third signal line 23 in the same manner as that the first signal line 21 and the third signal line 23 are located on and below the second signal line 22 in the flexible circuit board 1 including three signal lines described above.

That is, in the embodiment of the present invention, in the vertical section 100, the plurality of signal lines is located on the same vertical line and then extend, and in the horizontal section 200, the positions of other signal line(s) are changed by the via holes and extend so that any one signal line and other signal line(s) are located on the same horizontal line. Accordingly, the vertical section 100 and the horizontal section 200 are integrally formed in the single flexible circuit board 1.

As such, since the vertical section 100 and the horizontal section 200 are formed, as an advantage of the vertical section 100, the flexible circuit board 1 may be easily disposed in a narrow space in a wireless terminal, and as the gain of the horizontal section 200, the radius of curvature is decreased so as to be easily folded. Therefore, there is an appropriate effect on disposing the flexible circuit board 1 in the wireless terminal in various environments.

The horizontal section 200 may have a feature that allows the horizontal section 200 to be further folded in addition to the change of the position of the signal line, and it will be described below.

In the flexible circuit board 1 having the vertical section 100 and the horizontal section 200 formed thereon according to the embodiment of the present invention, as illustrated in FIGS. 2 and 4 to 8, the horizontal section 200 includes a first horizontal section 200A and a second horizontal section 200B.

As illustrated in FIG. 4, the first horizontal section 200A is a section which extends from the vertical section 100 and of which a position of a signal line is changed through a via hole.

The second horizontal section 200B is a section in which the signal line of which the position is changed through the via hole is extended and may allow the thickness to be thin or the interval to be formed.

First, as illustrated in FIG. 2, the second horizontal section 200B may extend from the first horizontal section 200A so as to be thinner than the first horizontal section 200A.

For example, as illustrated in FIG. 4, when the position of the signal line is changed to the upper surface or lower surface of the second dielectric 12, as illustrated in FIG. 2, since the first dielectric 11 and the third dielectric 13 are removed from the second horizontal section 200B, the thickness of the second horizontal section 200B may be decreased.

Further, as illustrated in FIG. 11, when the position of the signal line is changed to the upper surface or lower surface of the first dielectric 11, as illustrated in FIG. 10, since the second dielectric 12 and the third dielectric 13 are removed from the second horizontal section 200B, the thickness of the second horizontal section 200B may be decreased.

Further, as illustrated in FIG. 13, when the position of the signal line is changed to the upper surface or lower surface of the third dielectric 13, as illustrated in FIG. 12, since first dielectric 11 and the second dielectric 12 are removed from the second horizontal section 200B, the thickness of the second horizontal section 200B may be decreased.

As described above, since the thickness is decreased, the second horizontal section 200B has an effect of further reducing the radius of curvature.

Next, as illustrated in FIG. 14, the second horizontal section 200B may extend from the first horizontal section 200A so that intervals are formed between the first dielectric 11 and the second dielectric 12 and between the second dielectric 12 and the third dielectric 13.

For example, as illustrated in FIG. 4, when the position of the signal line is changed to the upper surface or lower surface of the second dielectric 12, as illustrated in FIG. 14, in the second horizontal section 200B, bonding sheets 80 are removed and separated between the first dielectric 11 and the second dielectric 12 and between the second dielectric 12 and the third dielectric 13, and intervals may be formed between the first dielectric 11 and the second dielectric 12 and between the second dielectric 12 and the third dielectric 13 from which the bonding sheets 80 are removed and separated.

As such, in the second horizontal section 200B, when the first dielectric 11 and the third dielectric 13 are separated from the second dielectric 12 by forming the intervals, the radius of curvature is calculated except for the separated first dielectric 11 and third dielectric 13 to be further reduced. The first dielectric 11 and the third dielectric 13 prevent the second dielectric 12 from being in direct contact with a housing 2 and the like to be damaged by friction when the second dielectric 12 is folded.

The detailed embodiments of the gist described above will be described below.

The flexible circuit board 1 having the vertical section 100 and the horizontal section 200 according to the embodiment of the present invention, as illustrated in FIGS. 2 to 8, includes the first dielectric 11, the second dielectric 12, the vertical section 100, and the horizontal section 200.

The first dielectric 11 has the first signal line 21 in contact with an upper surface or lower surface thereof, has a greater than the first signal line 21, and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The vertical section 100 is a section in which the first signal line 21 and the second signal line 22 are located on the same vertical line and the first signal line 21 and the second signal line 22 extend in parallel.

The horizontal section 200 is a section in which the position of the first signal line 21 is changed to be in contact with the upper surface or lower surface of the second dielectric 12 through the first via hole H1 so that the first signal line 21 is spaced apart from the second signal line 22 in a horizontal direction.

The flexible circuit board 1 having the vertical section 100 and the horizontal section 200 according to the embodiment of the present invention, as illustrated in FIGS. 2 to 8, further includes a third dielectric 13.

The third dielectric 13 is located below the second dielectric 12, has the third signal line 23 in contact with the upper or lower surface thereof, has a greater width than the third signal line 23, and extends along an extension direction of the third signal line 23.

The flexible circuit board 1 having the vertical section 100 and the horizontal section 200 according to the embodiment of the present invention, as illustrated in FIGS. 2 to 8, includes the following features.

In the vertical section 100, the second signal line 22 and the third signal line 23 are located on the same vertical line and the second signal line 22 and the third signal line 23 extend in parallel.

In the horizontal section 200, the position of the third signal line 23 is changed to be in contact with the upper surface or lower surface of the second dielectric 12 through the third via hole H3 so that the third signal line 23 is spaced apart from the second signal line 22 in a horizontal direction.

In the second horizontal section 200B, the thickness may be decreased, or the intervals may be formed.

First, an embodiment in which the thickness of the second horizontal section 200B is decreased will be described below.

In the flexible circuit board 1 having the vertical section 100 and the horizontal section 200 according to the embodiment of the present invention, as illustrated in FIGS. 2 to 8, the horizontal section 200 includes a first horizontal section 200A and a second horizontal section 200B.

The first horizontal section 200A is a section which extends from the vertical section 100, and in which the positions of the first signal line 21 and the third signal line 23 are changed through the first via hole H1 and the third via hole H3.

In the second horizontal section 200B, at least one of the first dielectric 11 and the third dielectric 13 is removed to be thinner than the first horizontal section 200A.

The flexible circuit board 1 having the vertical section 100 and the horizontal section 200 according to the embodiment of the present invention, as illustrated in FIGS. 2 to 8, includes a first sub dielectric 41, a second sub dielectric 42, a first side dielectric 61, and a second side dielectric 62.

The first sub dielectric 41 has a first sub ground 51 in contact with the upper surface or lower surface thereof and is located between the first dielectric 11 and the second dielectric 12.

The second sub dielectric 42 has a second sub ground 52 in contact with the upper surface or lower surface thereof and is located between the second dielectric 12 and the third dielectric 13.

The first side dielectric 61 has a first side ground 71 in contact with the upper surface or lower surface thereof and is located on the first dielectric 11.

The second side dielectric 62 has a second side ground 72 in contact with the upper surface or lower surface thereof and is located on the third dielectric 13.

In the second horizontal section 200B, at least one of the first dielectric 11, the third dielectric 13, the first sub dielectric 41, the second sub dielectric 42, the first side dielectric 61, and the second side dielectric 62 is removed.

Figure 5:
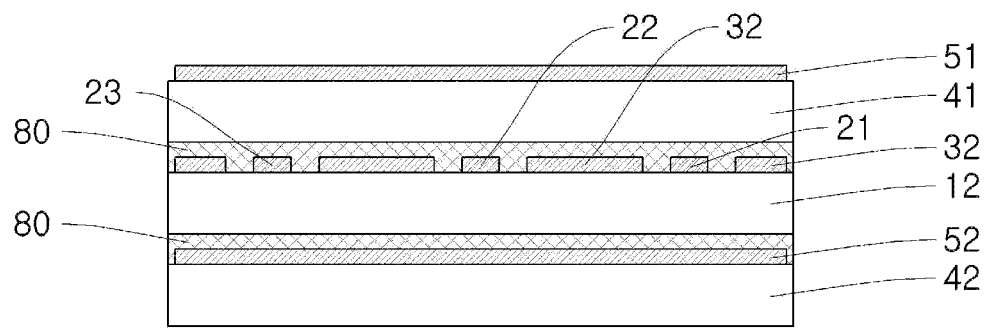
FIGS. 5 to 8 are diagrams illustrating a cross section of a second horizontal section according to the embodiment of the present invention.

For example, as illustrated in FIG. 5, in the second horizontal section 200B, as compared with the first horizontal section 200A, the first dielectric 11, the third dielectric 13, the first side dielectric 61, and the second side dielectric 62 may be removed.

Figure 6:
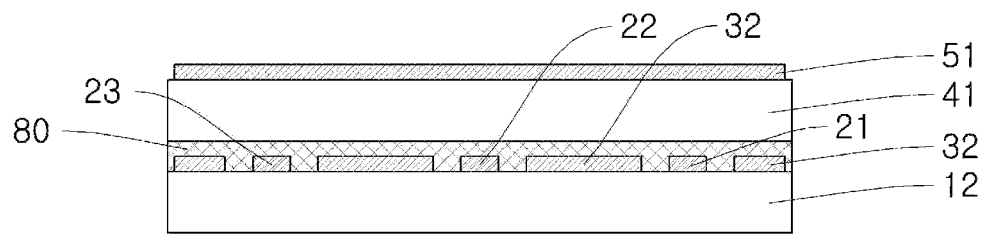

Further, as illustrated in FIG. 6, in the second horizontal section 200B, as compared with the first horizontal section 200A, the first dielectric 11, the third dielectric 13, the second sub dielectric 42, the first side dielectric 61, and the second side dielectric 62 may be removed.

Further, as illustrated in FIG. 7, in the second horizontal section 200B, as compared with the first horizontal section 200A, the first dielectric 11, the third dielectric 13, the first sub dielectric 41, the first side dielectric 61, and the second side dielectric 62 may be removed.

Further, as illustrated in FIG. 8, in the second horizontal section 200B, as compared with the first horizontal section 200A, the first dielectric 11, the third dielectric 13, the first sub dielectric 41, the second sub dielectric 42, the first side dielectric 61, and the second side dielectric 62 may be removed.

Next, an embodiment in which the second horizontal section 200B includes intervals between the dielectrics will be described below.

In the flexible circuit board 1 having the vertical section 100 and the horizontal section 200 according to the embodiment of the present invention, as illustrated in FIGS. 14, 15A, 15B, and 15C, the horizontal section 200 includes a first horizontal section 200A and a second horizontal section 200B.

The first horizontal section 200A is a section which extends from the vertical section 100 and in which a gap between the first dielectric 11 and the second dielectric 12 and a gap between the second dielectric 12 and the third dielectric 13 are bonded to each other by direct thermal melt bonding or by any one a bonding sheet 80 and a prepreg 80.

The second horizontal section 200B is a section which extends from the first horizontal section 200A and in which a gap between the first dielectric 11 and the second dielectric 12 and a gap between the second dielectric 12 and the third dielectric 13 are separated from each other without being bonded by thermal melt bonding or a medium.

The flexible circuit board 1 having the vertical section 100 and the horizontal section 200 according to the embodiment of the present invention, as illustrated in FIGS. 14, 15A, 15B, and 15C, further includes a first sub dielectric 41, a second sub dielectric 42, a first side dielectric 61, and a second side dielectric 62.

The first sub dielectric 41 has a first sub ground 51 in contact with the upper surface or lower surface thereof and is located between the first dielectric 11 and the second dielectric 12.

The second sub dielectric 42 has a second sub ground 52 in contact with the upper surface or lower surface thereof and is located between the second dielectric 12 and the third dielectric 13.

The first side dielectric 61 has a first side ground 71 in contact with the upper surface or lower surface thereof and is located on the first dielectric 11.

The second side dielectric 62 has a second side ground 72 in contact with the upper surface or lower surface thereof and is located below the third dielectric 13.

In the second horizontal section 200B, the first dielectric 11 is separated from the first sub dielectric 41 and the first side dielectric 61.

For example, as illustrated in FIGS. 14, 15A, 15B, and 15C, in the first horizontal section 200A, the intervals may be formed at positions where the bonding sheet 80, which is located so that the first dielectric 11 is bonded to the first sub dielectric 41 and the first side dielectric 61, is removed and separated from the second horizontal section 200B and the bonding sheet 80 is removed.

In the second horizontal section 200B, the third dielectric 13 is separated from the second sub dielectric 42 and the second side dielectric 62.

For example, as illustrated in FIGS. 14, 15A, 15B, and 15C, in the first horizontal section 200A, the intervals may be formed at positions where the bonding sheet 80, which is located so that the third dielectric 13 is bonded to the second sub dielectric 42 and the second side dielectric 62, is removed and separated from the second horizontal section 200B and the bonding sheet 80 is removed.

In addition, although not illustrated in FIGS. 14, 15A, 15B, and 15C, if necessary, in the second horizontal section 200B, the second dielectric 12 may be separated from the first sub dielectric 41 and the second sub dielectric 42.

For example, in the first horizontal section 200A, the intervals may be formed at positions where the bonding sheet 80 located so that the second dielectric 12 is bonded to the first sub dielectric 41 and the second sub dielectric 42 is removed and separated from the second horizontal section 200B and the bonding sheet 80 is removed.

The embodiment where in the second horizontal section 200B, the signal line is located on the upper surface or lower surface of the second dielectric 12 has been described above, but hereinafter, an embodiment where the signal line is located in the first dielectric 11 or the third dielectric 13 will be described.

First, an embodiment in which in the second horizontal section 200B, the signal line is located in the first dielectric 11 will be described.

The flexible circuit board 1 having a vertical section 100 and a horizontal section 200 according to the embodiment of the present invention, as illustrated in FIG. 11, includes a first dielectric 11, a second dielectric 12, a third dielectric 13, a vertical section 100, and a horizontal section 200.

The first dielectric 11 has the first signal line 21 in contact with an upper surface or lower surface thereof, has a greater than the first signal line 21, and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The third dielectric 13 is located below the second dielectric 12, has the third signal line 23 in contact with the upper or lower surface thereof, has a greater width than the third signal line 23, and extends along an extension direction of the third signal line 23.

The vertical section 100 is a section in which the first signal line 21, the second signal line 22, and the third signal line 23 are located on the same vertical line and the first signal line 21, the second signal line 22, and the third signal line 23 extend in parallel.

The horizontal section 200 is a section in which the positions of the second signal line 22 and the third signal line 23 are changed to be in contact with the upper surface or lower surface of the first dielectric 11 through the second via hole H2 and the third via hole H3, respectively, to be spaced apart from the first signal line 21 in a horizontal direction.

The horizontal section 200 includes the first horizontal section 200A and the second horizontal section 200B, and as illustrated in FIG. 10, the second horizontal section 200B may be thinner than the first horizontal section 200A, and as illustrated in FIG. 14, the interval may be formed.

Further, when the interval is formed, in FIG. 14, the second dielectric 12 is attached with the first sub dielectric 41 and the second sub dielectric 42, but instead, the first dielectric 11 may be attached with the first side dielectric 61 and the first sub dielectric 41.

Next, an embodiment in which in the second horizontal section 200B, the signal line is located in the third dielectric 13 will be described.

The flexible circuit board 1 having a vertical section 100 and a horizontal section 200 according to the embodiment of the present invention, as illustrated in FIGS. 12 and 13, includes a first dielectric 11, a second dielectric 12, a third dielectric 13, a vertical section 100, and a horizontal section 200.

The first dielectric 11 has the first signal line 21 in contact with an upper surface or lower surface thereof, has a greater than the first signal line 21, and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The third dielectric 13 is located below the second dielectric 12, has the third signal line 23 in contact with the upper or lower surface thereof, has a greater width than the third signal line 23, and extends along an extension direction of the third signal line 23.

The vertical section 100, as illustrated in FIG. 3, is a section in which the first signal line 21, the second signal line 22, and the third signal line 23 are located on the same vertical line and the first signal line 21, the second signal line 22, and the third signal line 23 extend in parallel.

The horizontal section 200, as illustrated in FIG. 13, is a section in which the positions of the first signal line 21 and the second signal line 22 are changed to be in contact with the upper surface or lower surface of the third dielectric 13 through the first via hole H1 and second via hole H2, respectively, to be spaced apart from the third signal line 23 in a horizontal direction.

The horizontal section 200 includes the first horizontal section 200A and the second horizontal section 200B, and as illustrated in FIG. 12, the second horizontal section 200B may be thinner than the first horizontal section 200A, and as illustrated in FIG. 14, the interval may be formed.

Further, when the interval is formed, in FIG. 14, the second dielectric 12 is attached with the first sub dielectric 41 and the second sub dielectric 42, but instead, the third dielectric 13 may be attached with the second side dielectric 62 and the second sub dielectric 42.

An embodiment in which the first horizontal section 200A includes a ground via hole GH will be described below.

In the flexible circuit board 1 having the vertical section 100 and the horizontal section 200 according to the embodiment of the present invention, as illustrated in FIGS. 2 to 9, the horizontal section 200 includes a first horizontal section 200A and a second horizontal section 200B.

The first horizontal section 200A is a section which extends from the vertical section 100 and has a first via hole H1 and a third via hole H3 formed thereon.

The second horizontal section 200B is a section in which the positions of the first signal line 21 and the third signal line 23 are changed through the first via hole H1 and the third via hole H3.

The flexible circuit board 1 having the vertical section 100 and the horizontal section 200 according to the embodiment of the present invention, as illustrated in FIG. 9, includes a first ground 31, a second ground 32, and a third ground 33.

The first ground 31 is in contact with the first signal line 21 of the first dielectric 11 so as to be formed around the first signal line 21 in the vertical section 100 and the first horizontal section 200A.

The second ground 32 is in contact with the second signal line 22 of the second dielectric 12 so as to be formed around the second signal line 22 in the vertical section 100 and the first horizontal section 200A.

The third ground 33 is in contact with the third signal line 23 of the third dielectric 13 so as to be formed around the third signal line 23 in the vertical section 100 and the first horizontal section 200A.

The flexible circuit board 1 having the vertical section 100 and the horizontal section 200 according to the embodiment of the present invention, as illustrated in FIG. 9, includes a ground via hole GH.

The ground via hole GH vertically passes through the first ground 31, the second ground 32, and the third ground 33 so as to be electrically connected to the first ground 31, the second ground 32, and the third ground 33 around a portion formed with the first via hole H1 and the third via hole H3.

As illustrated in FIG. 9, the ground via hole GH may pass through the first dielectric 11, the second dielectric 12, and the third dielectric 13 so as to vertically pass through the first ground 31, the second ground 32, and the third ground 33.

Further, the ground via hole GH may vertically pass through the first sub ground 51, the second sub ground 52, the first side ground 71, and the second side ground 72, and to this end, the ground via hole GH may vertically pass through the first sub dielectric 41, the second sub dielectric 42, the first side dielectric 61, and the second side dielectric 62.

The embodiment in which in the horizontal section 200, the first signal line 21, the second signal line 22, and the third signal line 23 are spaced part from each other in a horizontal direction has been described, but the first signal line 21, the second signal line 22, and the third signal line 23 may be located with zigzag, and the description thereof will be described.

The flexible circuit board 1 having a vertical section 100 and a horizontal section 200 according to the embodiment of the present invention, as illustrated in FIG. 20, includes a first dielectric 11, a second dielectric 12, a third dielectric 13, a first sub dielectric 41, a second sub dielectric 42, a vertical section 100, and a horizontal section 200.

The first dielectric 11 has the first signal line 21 in contact with an upper surface or lower surface thereof, has a greater than the first signal line 21, and extends along an extension direction of the first signal line 21.

The second dielectric 12 is located below the first dielectric 11, has the second signal line 22 in contact with the upper or lower surface thereof, has a greater width than the second signal line 22, and extends along an extension direction of the second signal line 22.

The third dielectric 13 is located below the second dielectric 12, has the third signal line 23 in contact with the upper or lower surface thereof, has a greater width than the third signal line 23, and extends along an extension direction of the third signal line 23.

The first sub dielectric 41 is located between the first dielectric 11 and the second dielectric 12 and formed to have the same width as the first dielectric 11 and the second dielectric 12.

The second sub dielectric 42 is located between the second dielectric 12 and the third dielectric 13 and formed to have the same width as the second dielectric 12 and the third dielectric 13.

The vertical section 100 is a section in which the first signal line 21, the second signal line 22, and the third signal line 23 are located on the same vertical line and the first signal line 21, the second signal line 22, and the third signal line 23 extend in parallel.

The horizontal section 200 is a section in which the positions of the first signal line 21 and the third signal line 23 are changed to be in contact with the upper surface or lower surface of the first sub dielectric 41 or to be in contact with the upper surface or lower surface of the second sub dielectric 42 through the first via hole H1 and the third via hole H3, respectively, to be spaced apart from the second signal line 22 in a horizontal direction.

That is, the second signal line 22 is in contact with the upper surface or lower surface of the second dielectric 12, and the first signal line 21 and the third signal line 23 are in contact with the upper surface or lower surface of the second sub dielectric 42. The second signal line 22 is spaced apart from the first signal line 21 and the third signal line 23 in the vertical direction and located between the first signal line 21 and the third signal line 23 in the horizontal direction, so that the first signal line 21, the second signal line 22 and the third signal line 23 are arranged in zigzag.

As such, when the first signal line 21, the second signal line 22 and the third signal line 23 are arranged in zigzag, each signal line is located in a diagonal line to increase a separation distance, and thus may be located closely in the horizontal direction as compared to when each signal line is located on the same horizontal line, thereby reducing the width of the dielectric.

The embodiment in which the first signal line 21 and the third signal line 23 are located below the second signal line 22 has been described above, but the first signal line 21 and the third signal line 23 are located on the upper surface or lower surface of the first sub dielectric 41 instead of the second sub dielectric 42 to be located on the second signal line 22. Further, the first signal line 21 and the third signal line 23 may be located on the upper surface or lower surface of the first dielectric 11 or the third dielectric 13 instead of the second sub dielectric 42.

The flexible circuit board 1 having the vertical section 100 and the horizontal section 200 according to the embodiment of the present invention includes the following features.

In the horizontal section 200, the horizontal widths of the first dielectric 11, the second dielectric 12, and the third dielectric 13 are larger than a width at which the first signal line 21 and the third signal line 23 are spaced in the horizontal direction.

That is, the horizontal width of the vertical section 100 illustrated in FIG. 3 is larger than the width of the horizontal section 200 illustrated in FIG. 4.

FIGS. 3 to 8 have illustrated that the signal line is in contact with the upper surface of the dielectric, and as illustrated in FIGS. 16 to 19, some of the signal lines are in contact with the upper surface of the dielectric and the remaining signal lines may be in contact with the lower surface of the dielectric.

Although not illustrated, all the signal lines may be in contact with the lower surface of the dielectric.

The embodiment described above may be divided into three embodiments according to a shape.

First, a first embodiment will be described below.

In the flexible circuit board 1 having the vertical section 100 and the horizontal section 200 according to the embodiment of the present invention, the horizontal section 200, as illustrated in FIG. 24, includes a first-A bending section 211A, a first-A extension section 221A, a first-B bending section 211B, a first-B extension section 221B, a first-A change section 231A, and a first-C extension section 221C.

The first-A bending section 211A is a section in which the first signal line 21 extends from the vertical section 100 to be bent in a horizontal direction of the vertical section 100.

The first-A extension section 221A is a section in which the first signal line 21 extends from the first-A bending section 211A in a direction bent by the first-A bending section 211A.

The first-B bending section 211B is a section in which the first signal line 21 extends from the first-A extension section 221A to be bent in a horizontal direction of the first-A extension section 221A.

The first-B extension section 221B is a section in which the first signal line 21 extends from the first-B bending section 211B in a direction bent by the first-B bending section 211B.

The first-A change section 231A is a section in which the position of the first signal line 21 is changed to be in contact with the upper surface or lower surface of the second dielectric 12 through the first via hole H1.

The first-C extension section 221C is a section in which the first signal line 21 extends from the first-A change section 231A in the same direction as the first-B extension section 221B.

In the flexible circuit board 1 having the vertical section 100 and the horizontal section 200 according to the embodiment of the present invention, as illustrated in FIG. 24, the horizontal section 200 includes the following features.

The horizontal section 200 includes a second-A extension section 222A in which the second signal line 22 extends from the vertical section 100 in the same direction as the vertical section 100.

In the flexible circuit board 1 having the vertical section 100 and the horizontal section 200 according to the embodiment of the present invention, as illustrated in FIG. 24, the horizontal section 200 includes a third-A bending section 213A, a third-A extension section 223A, a third-B bending section 213B, a third-B extension section 223B, a third-A change section 233A, and a third-C extension section 223C.

The third-A bending section 213A is a section in which the third signal line 23 extends from the vertical section 100 to be bent in a horizontal direction of the vertical section 100.

The third-A extension section 223A is a section which the third signal line 23 extends from the third-A bending section 213A in a direction bent by the third-A bending section 213A.

The third-B bending section 213B is a section which the third signal line 23 extends from the third-A extension section 223A to be bent in a horizontal direction of the third-A extension section 223A.

The third-B extension section 223B is a section which the third signal line 23 extends from the third-B bending section 213B in a direction bent by the third-B bending section 213B.

The third-A change section 233A is a section in which the position of the third signal line 23 is changed to be in contact with the upper surface or lower surface of the second dielectric 12 through the third via hole H3.

The third-C extension section 223C is a section in which the third signal line 23 extends from the third-A change section 233A in the same direction as the third-B extension section 223B.

The length of the first-A extension section 221A described above is adjusted to adjust the separation distance between the first signal line 21 and the second signal line 22 in the second horizontal section 200B.

For example, when the length of the first-A extension section 221A is decreased, the separation distance is decreased, and when the length of the first-A extension section 221A is increased, the separation distance is increased.

Further, the length of the third-A extension section 223A is adjusted to adjust the separation distance between the second signal line 22 and the third signal line 23 in the second horizontal section 200B.

The adjustment of the separation distance is to minimize the separation distance by excluding the first-A extension section 221A and the third-A extension section 223A, and this will be described below.

In the flexible circuit board 1 having the vertical section 100 and the horizontal section 200 according to the embodiment of the present invention, as illustrated in FIG. 25, the horizontal section 200 includes a first-A bending section 211A, a first-B bending section 211B, a first-B extension section 221B, a first-A change section 231A, a first-C extension section 221C, a second-A extension section 222A, a third-A bending section 213A, a third-B bending section 213B, a third-B extension section 223B, a third-A change section 233A, and a third-C extension section 223C.

The first-A bending section 211A is a section in which the first signal line 21 extends from the vertical section 100 to be bent in a horizontal direction of the vertical section 100.

The first-B bending section 211B is a section in which the first signal line 21 extends from the first-A bending section 211A to be bent in a horizontal direction of a direction bent by the first-A bending section 211A.

The first-B extension section 221B is a section in which the first signal line 21 extends from the first-B bending section 211B in a direction bent by the first-B bending section 211B.

The first-A change section 231A is a section in which the position of the first signal line 21 is changed to be in contact with the upper surface or lower surface of the second dielectric 12 through the first via hole H1.

The first-C extension section 221C is a section in which the first signal line 21 extends from the first-A change section 231A in the same direction as the first-B extension section 221B.

The second-A extension section 222A is a section in which the second signal line 22 extends from the vertical section 100 in the same direction as the vertical section 100.

The third-A bending section 213A is a section in which the third signal line 23 extends from the vertical section 100 to be bent in a horizontal direction of the vertical section 100.

The third-B bending section 213B is a section in which the third signal line 23 extends from the third-A bending section 213A to be bent in a horizontal direction of a direction bent by the third-A bending section 213A.

The third-B extension section 223B is a section in which the third signal line 23 extends from the third-B bending section 213B in a direction bent by the third-B bending section 213B.

The third-A change section 233A is a section in which the position of the third signal line 23 is changed to be in contact with the upper surface or lower surface of the second dielectric 12 through the third via hole H3.

The third-C extension section 223C is a section in which the third signal line 23 extends from the third-A change section 233A in the same direction as the third-B extension section 223B.

FIGS. 27 to 34 are diagrams sequentially illustrating a lamination structure of FIG. 2 according to the embodiment of the present invention, and FIGS. 35 to 40 are diagrams are diagrams sequentially illustrating a lamination structure of FIG. 14 according to the embodiment of the present invention.

The lamination structure is described based on the first embodiment, but the second embodiment and the third embodiment may be also applied.

The lamination structure of FIG. 2 and the lamination structure of FIG. 14 are the same as each other and there is a difference in length of a dielectric according to the removal of the dielectric.

The lamination structure will be described below in order from the bottom to the top in a dielectric unit.

Figure 27:
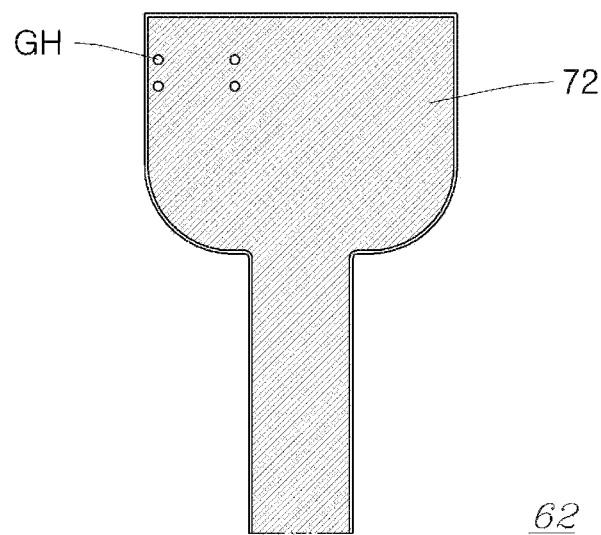
FIGS. 27 to 34 are diagrams illustrating sequentially a lamination structure of FIG. 2 according to the embodiment of the present invention.
Figure 34:
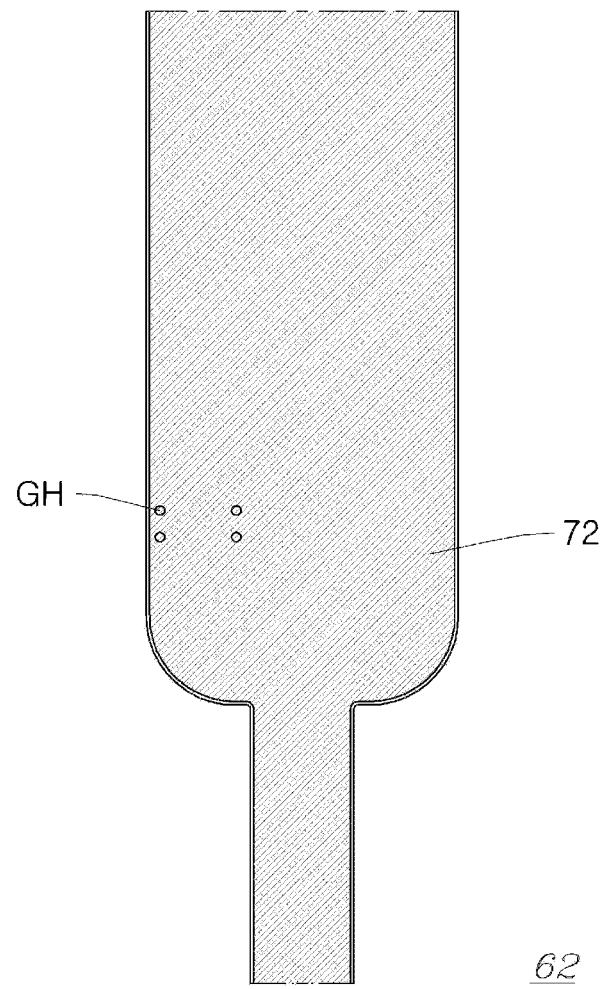

As illustrated in FIG. 27 or 34, a second side dielectric 62 is disposed so that a second side ground 72 is in contact with the upper surface thereof.

Figure 28:
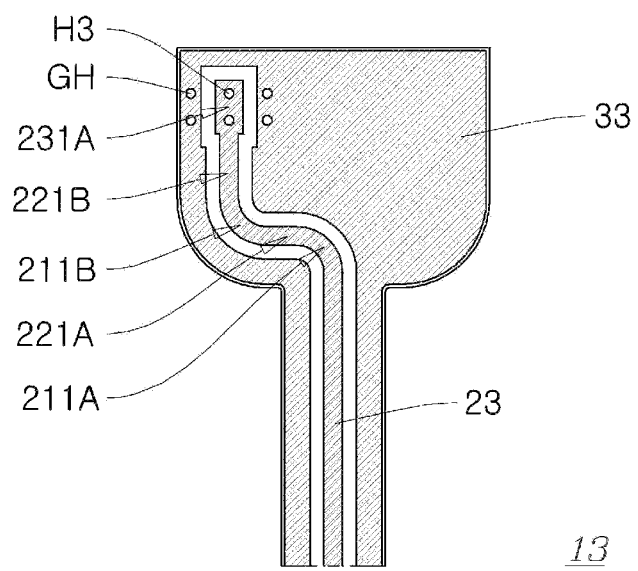
Figure 35:
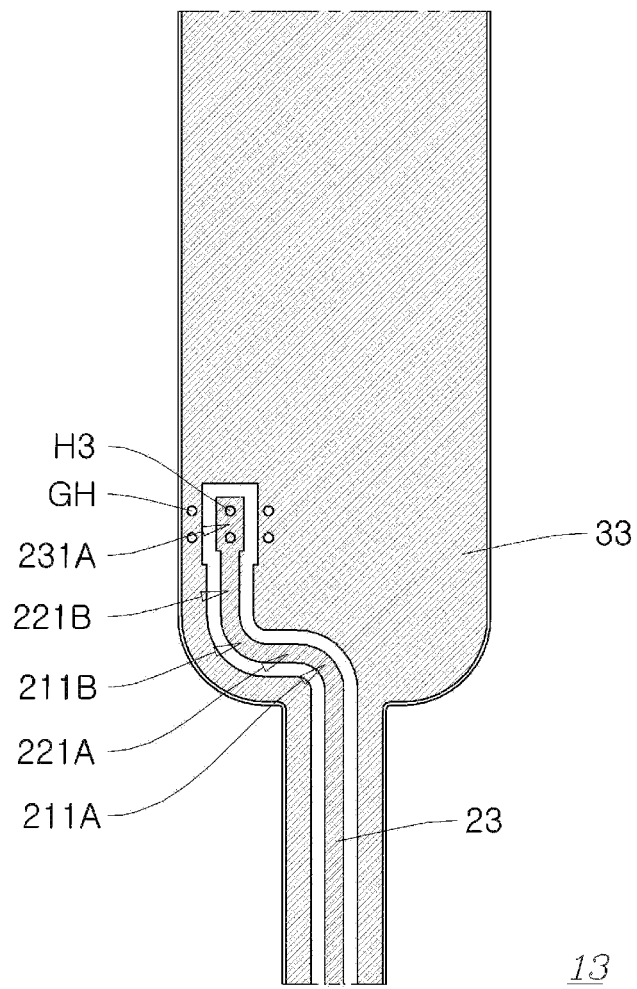
FIGS. 35 to 40 are diagrams sequentially illustrating a lamination structure of FIG. 14 according to the embodiment of the present invention.

As illustrated in FIG. 28 or 35, a third dielectric 13 is disposed so that a third ground 33 is in contact with the upper surface thereof.

The third signal line 23 is located inside the third ground 33 before the position is changed through the third via hole H3.

Figure 29:
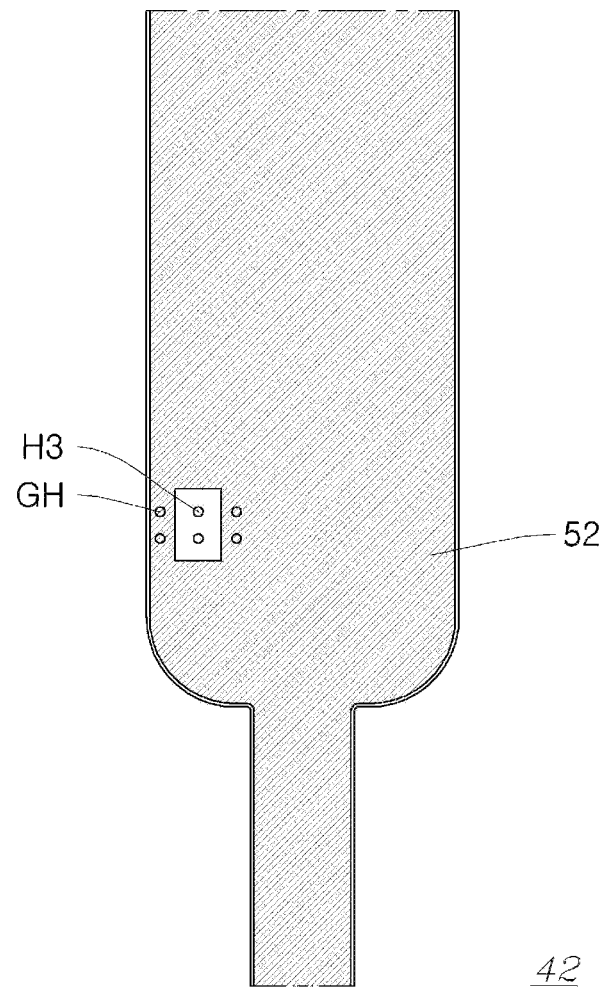
Figure 36:
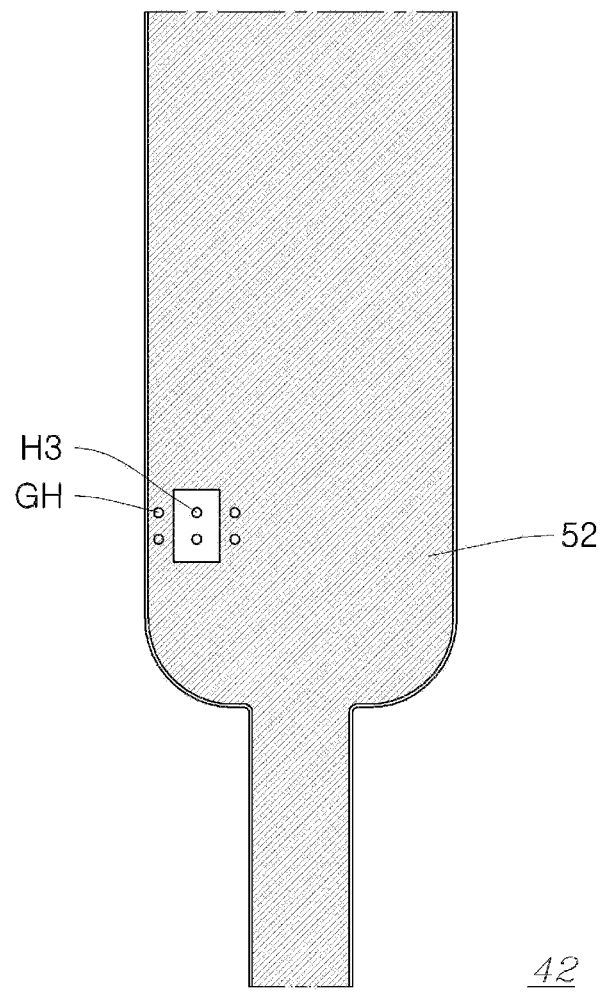

As illustrated in FIG. 29 or 36, a second sub dielectric 42 is disposed so that a second sub ground 52 is in contact with the upper surface thereof.

Figure 30:
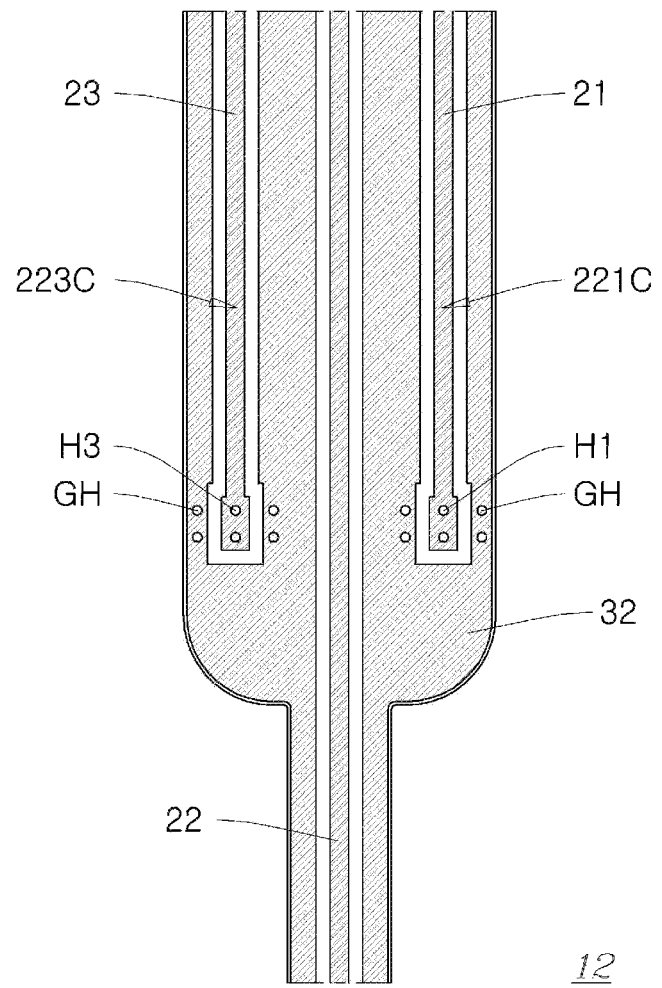
Figure 37:
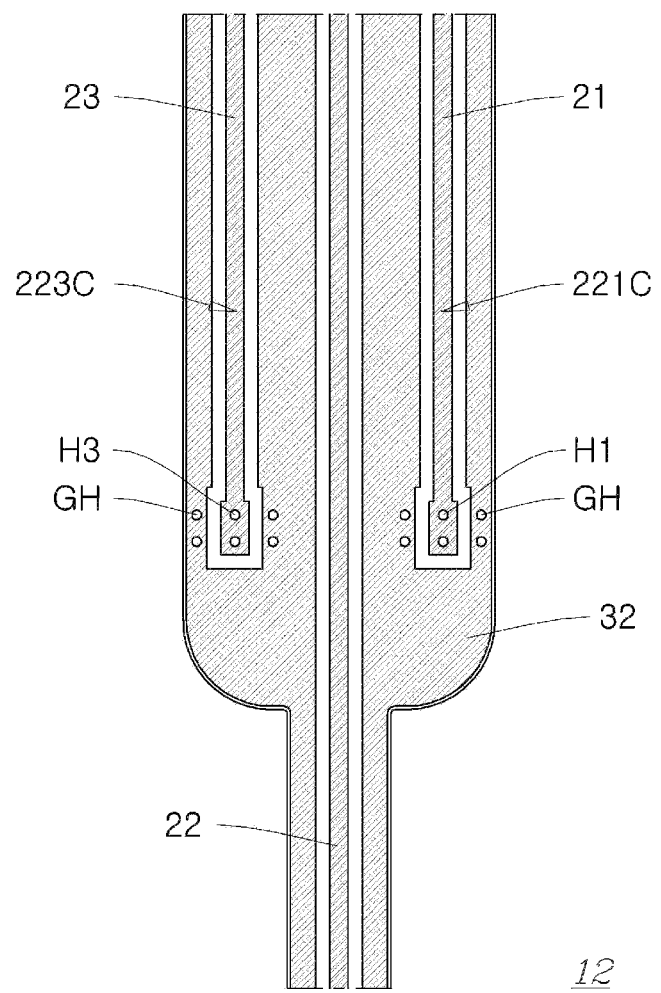

As illustrated in FIG. 30 or 37, a second dielectric 12 is disposed so that a second ground 32 is in contact with the upper surface thereof.

Inside the second ground 32, the first signal line 21 and the third signal line 23 of which the positions are changed by the first via hole H1 and the third via hole H3 are located and the second signal line 22 is located.

Figure 31:
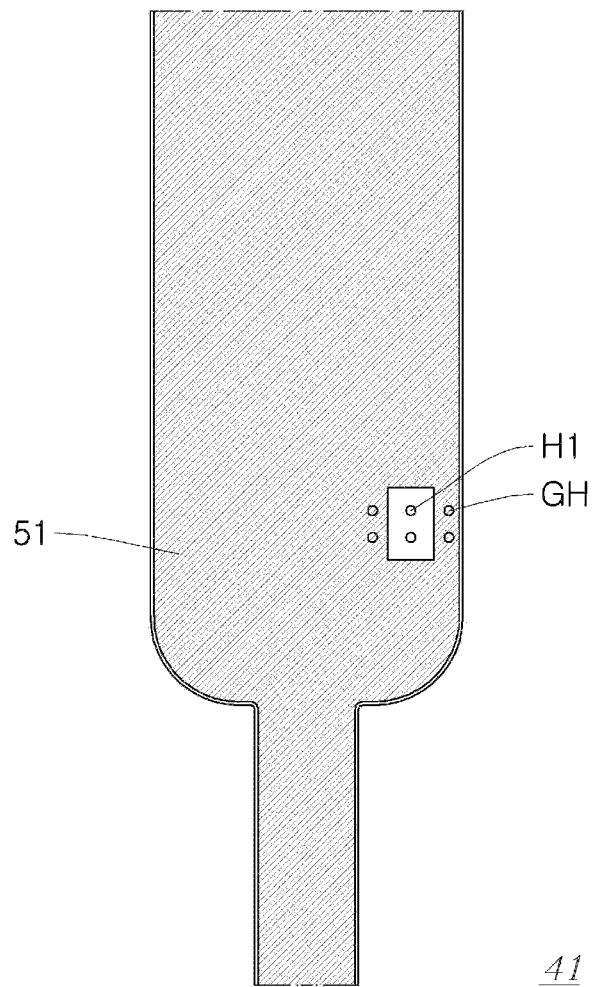
Figure 38:
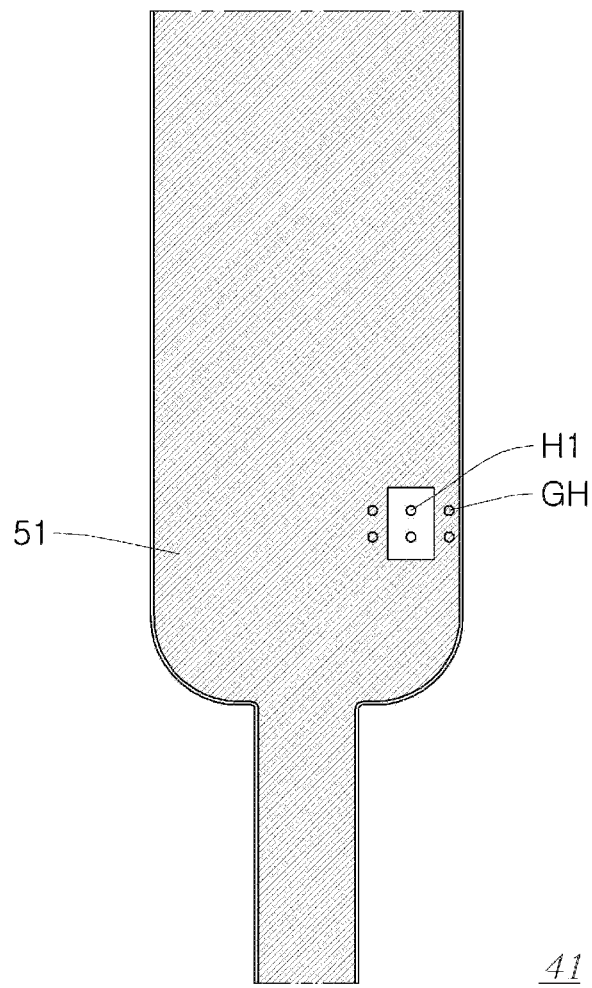

As illustrated in FIG. 31 or 38, a first sub dielectric 41 is disposed so that a first sub ground 51 is in contact with the upper surface thereof.

Figure 32:
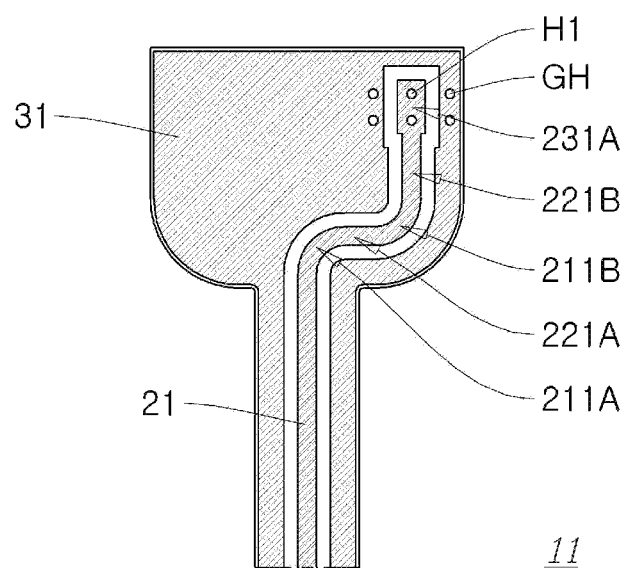

As illustrated in FIG. 32 or 39, a first dielectric 11 is disposed so that a first ground 31 is in contact with the upper surface thereof.

The first signal line 21 is located inside the first ground 31 before the position is changed through the first via hole H1.

Figure 33:
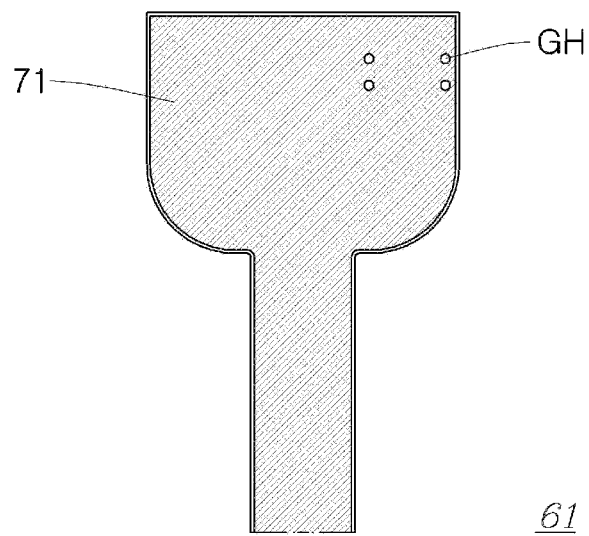

As illustrated in FIG. 33 or 40, a first side dielectric 61 is disposed so that a first side ground 71 is in contact with the upper surface thereof.

Next, a second embodiment will be described below.

In the flexible circuit board 1 having the vertical section 100 and the horizontal section 200 according to the embodiment of the present invention, as illustrated in FIG. 41, the horizontal section 200 includes a first-A bending section 211A, a first-A extension section 221A, a first-A change section 231A, and a first-B extension section 221B.

The first-A bending section 211A is a section in which the first signal line 21 extends from the vertical section 100 to be bent in a horizontal direction of the vertical section 100.

The first-A extension section 221A is a section in which the first signal line 21 extends from the first-A bending section 211A in a direction bent by the first-A bending section 211A.

The first-A change section 231A is a section in which the position of the first signal line 21 is changed through the first via hole H1.

The first-B extension section 221B is a section in which the first signal line 21 extends from the first-A change section 231A in the same direction as the first-A extension section 221A.

In the flexible circuit board 1 having the vertical section 100 and the horizontal section 200 according to the embodiment of the present invention, as illustrated in FIG. 41, the horizontal section 200 includes a second-A bending section 212A and a second-A extension section 222A.

The second-A bending section 212A is a section in which the second signal line 22 extends from the vertical section 100 to be bent in a horizontal direction of the vertical section 100.

The second-A extension section 222A is a section in which the second signal line 22 extends from the second-A bending section 212A in a direction bent by the second-A bending section 212A.

In the flexible circuit board 1 having the vertical section 100 and the horizontal section 200 according to the embodiment of the present invention, as illustrated in FIG. 41, the horizontal section 200 includes a third-A bending section 213A, a third-A extension section 223A, a third-A change section 233A, and a third-B extension section 223B.

The third-A bending section 213A is a section in which the third signal line 23 extends from the vertical section 100 to be bent in a horizontal direction of the vertical section 100.

The third-A extension section 223A is a section which the third signal line 23 extends from the third-A bending section 213A in a direction bent by the third-A bending section 213A.

The third-A change section 233A is a section in which the position of the third signal line 23 is changed through the third via hole H3.

The third-B extension section 223B is a section in which the third signal line 23 extends from the third-A change section 233A in the same direction as the third-A extension section 223A.

Next, a third embodiment will be described below.

In a flexible circuit board 1 having a vertical section 100 and a horizontal section 200 according to an embodiment of the present invention, as illustrated in FIG. 42, the horizontal section 200 includes a first-A bending section 211A, a first-A extension section 221A, a first-A change section 231A, a first-B extension section 221B, a first-B bending section 211B, and a first-C extension section 221C.

The first-A bending section 211A is a section in which the first signal line 21 extends from the vertical section 100 to be bent in a horizontal direction of the vertical section 100.

The first-A extension section 221A is a section in which the first signal line 21 extends from the first-A bending section 211A in a direction bent by the first-A bending section 211A.

The first-A change section 231A is a section in which the position of the first signal line 21 is changed through the first via hole H1.

The first-B extension section 221B is a section in which the first signal line 21 extends from the first-A change section 231A in the same direction as the first-A extension section 221A.

The first-B bending section 211B is a section which extends from the second-B extension section 222B to be bent in a horizontal direction of the first-B extension section 221B.

The first-C extension section 221C is a section in which the first signal line 21 extends from the first-B bending section 211B in a direction bent by the first-B bending section 211B.

In the flexible circuit board 1 having the vertical section 100 and the horizontal section 200 according to the embodiment of the present invention, as illustrated in FIG. 42, the horizontal section 200 includes a second-A bending section 212A, a second-A extension section 222A, a second-B bending section 212B, and a second-B extension section 222B.

The second-A bending section 212A is a section in which the second signal line 22 extends from the vertical section 100 to be bent in a horizontal direction of the vertical section 100.

The second-A extension section 222A is a section in which the second signal line 22 extends from the second-A bending section 212A in a direction bent by the second-A bending section 212A.

The second-B bending section 212B is a section which extends from the second-A extension section 222A to be bent in a horizontal direction of the second-A extension section 222A.

The second-B extension section 222B is a section in which the second signal line 22 extends from the second-B bending section 212B in a direction bent by the second-B bending section 212B.

In the flexible circuit board 1 having the vertical section 100 and the horizontal section 200 according to an embodiment of the present invention, as illustrated in FIG. 42, the horizontal section 200 includes a third-A bending section 213A, a third-A extension section 223A, a third-A change section 233A, a third-B extension section 223B, a third-B bending section 213B, and a third-C extension section 223C.

The third-A bending section 213A is a section in which the third signal line 23 extends from the vertical section 100 to be bent in a horizontal direction of the vertical section 100.

The third-A extension section 223A is a section which the third signal line 23 extends from the third-A bending section 213A in a direction bent by the third-A bending section 213A.

The third-A change section 233A is a section in which the position of the third signal line 23 is changed through the third via hole H3.

The third-B extension section 223B is a section in which the third signal line 23 extends from the third-A change section 233A in the same direction as the third-A extension section 223A.

The third-B bending section 213B is a section which extends from the third-B extension section 223B to be bent in a horizontal direction of the third-B extension section 223B.

The third-C extension section 223C is a section in which the third signal line 23 extends from the third-B bending section 213B in a direction bent by the third-B bending section 213B.

In the first embodiment, the second embodiment, and the third embodiment, in the second horizontal section 200B, the thickness may be decreased or the intervals may be formed.

First, an embodiment in which the thickness of the second horizontal section 200B is decreased will be described below.

In the flexible circuit board 1 having the vertical section 100 and the horizontal section 200 according to the embodiment of the present invention, as illustrated in FIGS. 2 to 8, the horizontal section 200 includes a first horizontal section 200A and a second horizontal section 200B.

The first horizontal section 200A is a section which extends from the vertical section 100, and in which the positions of the first signal line 21 and the third signal line 23 are changed through the first via hole H1 and the third via hole H3.

At least one of the first dielectric 11 and the third dielectric 13 is removed from the second horizontal section 200B so that the second horizontal section 200B is thinner than the first horizontal section 200A.

The flexible circuit board 1 having the vertical section 100 and the horizontal section 200 according to the embodiment of the present invention, as illustrated in FIGS. 2 to 8, further includes a first sub dielectric 41, a second sub dielectric 42, a first side dielectric 61, and a second side dielectric 62.

The first sub dielectric 41 has a first sub ground 51 in contact with the upper surface or lower surface thereof and is located between the first dielectric 11 and the second dielectric 12.

The second sub dielectric 42 has a second sub ground 52 in contact with the upper surface or lower surface thereof and is located between the second dielectric 12 and the third dielectric 13.

The first side dielectric 61 has a first side ground 71 in contact with the upper surface or lower surface thereof and is located on the first dielectric 11.

The second side dielectric 62 has a second side ground 72 in contact with the upper surface or lower surface thereof and is located on the third dielectric 13.

The flexible circuit board 1 having the vertical section 100 and the horizontal section 200 according to the embodiment of the present invention, as illustrated in FIG. 42, includes the following features.

In the second horizontal section 200B, at least one of a first sub dielectric 41, a second sub dielectric 42, a first side dielectric 61, and a second side dielectric 62 is removed.

Next, an embodiment in which the second horizontal section 200B includes intervals between the dielectrics will be described below.

In the flexible circuit board 1 having the vertical section 100 and the horizontal section 200 according to the embodiment of the present invention, as illustrated in FIGS. 14, 15A, 15B, and 15C, the horizontal section 200 includes a first horizontal section 200A and a second horizontal section 200B.

The first horizontal section 200A is a section which extends from the vertical section 100 and in which the first dielectric 11 and the second dielectric 12 and the second dielectric 12 and the third dielectric 13 are bonded to each other by direct thermal melt bonding or by any one a bonding sheet 80 and a prepreg 80.

The second horizontal section 200B is a section which extends from the vertical first horizontal section 200A and in which the first dielectric 11 and the second dielectric 12 and the second dielectric 12 and the third dielectric 13 are not bonded to each other by direct thermal melt bonding or by a medium but separated from each other.

The flexible circuit board 1 having the vertical section 100 and the horizontal section 200 according to the embodiment of the present invention, as illustrated in FIGS. 14 to 15a, includes a first sub dielectric 41, a second sub dielectric 42, a first side dielectric 61, and a second side dielectric 62.

The first sub dielectric 41 has a first sub ground 51 in contact with the upper surface or lower surface thereof and is located between the first dielectric 11 and the second dielectric 12.

The second sub dielectric 42 has a second sub ground 52 in contact with the upper surface or lower surface thereof and is located between the second dielectric 12 and the third dielectric 13.

The first dielectric 11 has the first ground 31 in contact with the upper surface or lower surface thereof.

The third dielectric 13 has the third ground 33 in contact with the upper surface or lower surface thereof.

The first side dielectric 61 has a first side ground 71 in contact with the upper surface or lower surface thereof and is located on the first dielectric 11.

The second side dielectric 62 has a second side ground 72 in contact with the upper surface or lower surface thereof and is located below the third dielectric 13.

In the second horizontal section 200B, the first dielectric 11 is separated from the first sub dielectric 41 and the first side dielectric 61.

In the second horizontal section 200B, the second dielectric 12 is separated from the first sub dielectric 41 and the second sub dielectric 42.

In the second horizontal section 200B, the third dielectric 13 is separated from the second sub dielectric 42 and the second side dielectric 62.

The first ground 31, the third ground 33, the first side ground 71, and the second side ground 72 are all included as illustrated in FIG. 15A, or all not included as illustrated in FIG. 15B, or one or more thereof may be included as illustrated in FIG. 15C.

Further, although not illustrated, the first ground 31, the third ground 33, the first side ground 71, and the second side ground 72 may have mesh-shaped openings or periodic pattern-shaped openings so that the area of the ground is decreased to facilitate the bending in the second horizontal section 200B.

Although not illustrated, a conductive paste or an EMI shield film may be in contact with at least one of the top and the bottom of the second horizontal section 200B.

For example, in FIG. 5, a conductive paste or an EMI shield film may be in contact with at least one of the upper surface of the first sub ground 51 and the lower surface of the second sub dielectric 42.

The flexible circuit board 1 having the vertical section 100 and the horizontal section 200 according to the embodiment of the present invention, as illustrated in FIGS. 43A, 43B, and 46, includes the following features.

The horizontal section 200 is located so that a pair thereof is symmetrical to each other.

The vertical sections 100 are located at both sides of the pair of horizontal sections 200, respectively.

In FIGS. 43A and 43B, a pair of flexible circuit boards 1 of FIG. 42 may have a shape in which the horizontal sections 200 are connected to each other.

In addition, in FIG. 46, a pair of flexible circuit boards 1 of FIG. 24 may have a shape in which the horizontal sections 200 are connected to each other.

The flexible circuit board 1 having the vertical section 100 and the horizontal section 200 according to the embodiment of the present invention, as illustrated in FIG. 43A, includes the following features.

A pair of horizontal sections 200 are vertically folded so that the side surface faces the top, so that the position of the signal line located at the top is not changed through a via hole.

A pair of horizontal sections 200 are vertically folded so that the side surface faces the top, so that the position of the signal line located at the bottom is changed through the via hole. The signal transmission length of the signal line located at the top and the signal transmission length of the signal line located at the bottom may be adjusted to have the same length or a similar length.

Figure 55:
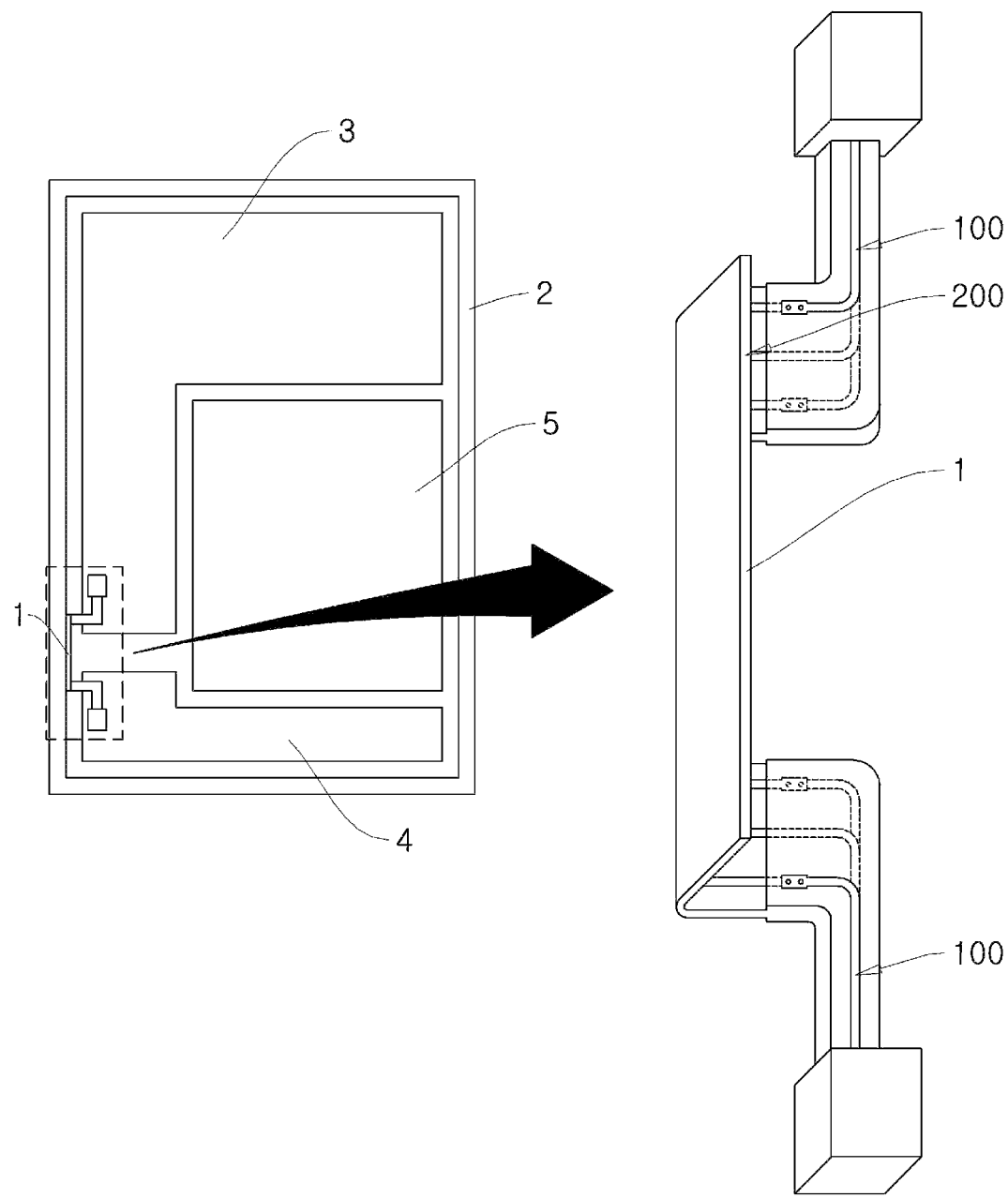

That is, as illustrated in FIG. 55, when the pair of horizontal sections 200 are vertically folded so that the side surface faces the top, the length of the first signal line 21 located at the top is bent outside the third signal line 23, so that the signal transmission length of the first signal line 21 is greater than the signal transmission length of the third signal line 23.

The position of the third signal line 23 is changed through the third via hole H3 to add the length of the third via hole H3 to the third signal line 23, so that the signal transmission lengths of the first signal line 21 and the third signal line 23 may be adjusted to have the same lengths or similar lengths.

In the flexible circuit board 1 having the vertical section 100 and the horizontal section 200 according to the embodiment of the present invention, as illustrated in FIGS. 47 to 50, the flexible circuit board 1 of FIGS. 43B and 46 includes the following features.

One signal line of which the position is changed through the via hole in one of the pair of horizontal sections 200 is not changed in position through the via hole in the other one of the pair of horizontal sections 200, so that the signal transmission length may be adjusted to have the same length as or similar length to the signal transmission length of the other signal line.

For example, as illustrated in FIG. 47, in one of the pair of horizontal sections 200, the position of the third signal line 23 is changed through the third via hole H3 and the position of the first signal line 21 is not changed through the via hole. As illustrated in FIG. 48, in the other section of the pair of horizontal sections 200, the position of the third signal line 23 is not changed through the via hole and the position of the first signal line 21 is changed through the first via hole H1.

That is, when in one of the pair of horizontal sections 200, a length A1 of the third via hole H3 is added to the length of the third signal line 23 so that the signal transmission length of the third signal line 23 is increased, in the other section of the pair of horizontal sections 200, the position of the third signal line 23 is not changed through the via hole to prevent the signal transmission length of the third signal line 23 from being increased. In the first signal line 21 of which the position is not changed through the via hole in one of the pair of horizontal sections 200 so that the signal transmission length is not increased, the length A1 of the first via hole H1 is added to the length of the first signal line 21 so that the signal transmission length of the third signal line 23 and the first signal line 21 may be adjusted to have the same length or similar length.

Length of first signal line 21 of which position is changed through via hole=length of first signal line 21 before position is changed through via hole+length A1 of first via hole H1

Length of third signal line 23 of which position is changed through via hole=length of third signal line 23 before position is changed through via hole+length A1 of third via hole H3

Length A1 of first via hole H1=length A1 of third via hole H3

Length of first signal line 21 of which position is changed through via hole=length of third signal line 23 of which position is changed through via hole Further, as illustrated in FIGS. 49 and 50, in one of the pair of horizontal sections 200, the position of the first signal line 21 is changed, and in the other section of the pair of horizontal sections 200, the position of the third signal line 23 is changed, so that the signal transmission length may be adjusted to have the same length or a similar length.

In the flexible circuit board 1 having the vertical section 100 and the horizontal section 200 according to the embodiment of the present invention, as illustrated in FIG. 55, the flexible circuit board 1 of FIG. 43A includes the following features.

The pair of horizontal sections 200 is vertically folded so that the side surface faces the top to be disposed in the wireless terminal.

The lower portion of the pair of horizontal sections 200 vertically folded is attached to a wall surface standing vertically inside the wireless terminal.

In the flexible circuit board 1 having the vertical section 100 and the horizontal section 200 according to the embodiment of the present invention, as illustrated in FIGS. 51 to 54, the flexible circuit board 1 of FIG. 46 includes the following features.

In the pair of the horizontal sections 200, a gap based on the surrounding in which the position of the signal line is changed through each via hole is disposed in the wireless terminal to pass through the upper portion or lower portion of a battery 5.

Figure 51:
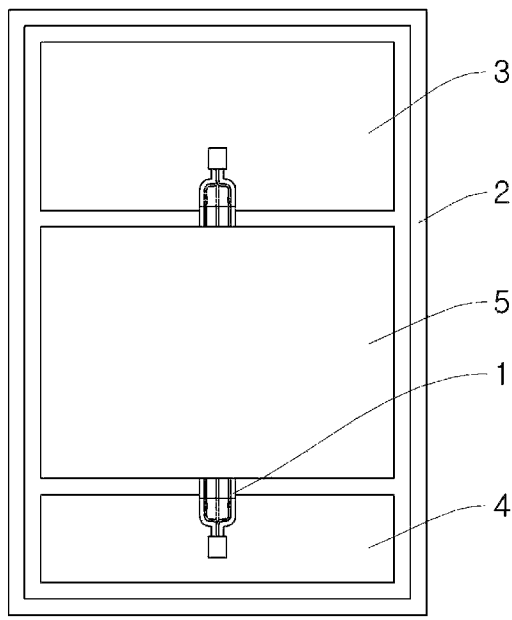
FIGS. 51 to 56 are diagrams illustrating examples of application to a wireless terminal of an embodiment of the present invention.
Figure 52:
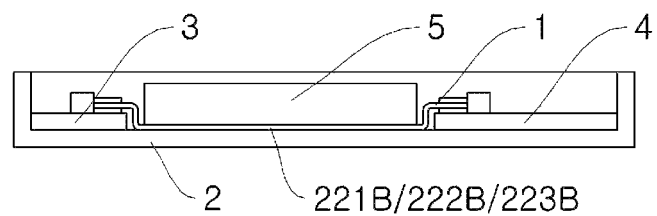
Figure 53:
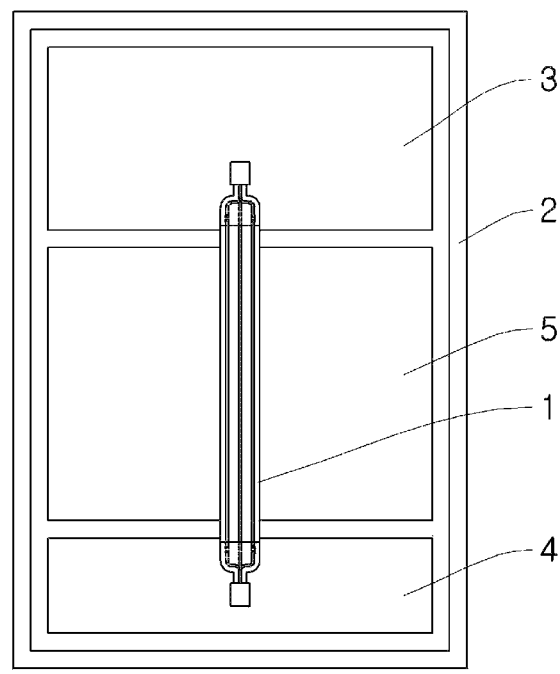
Figure 54:
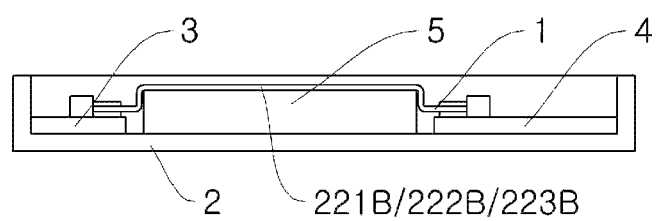

FIGS. 51 and 52 illustrate that the gap passes through the lower portion of the battery 5, and FIGS. 53 and 54 illustrate that the gap passes through the upper portion of the battery 5.

Figure 56:
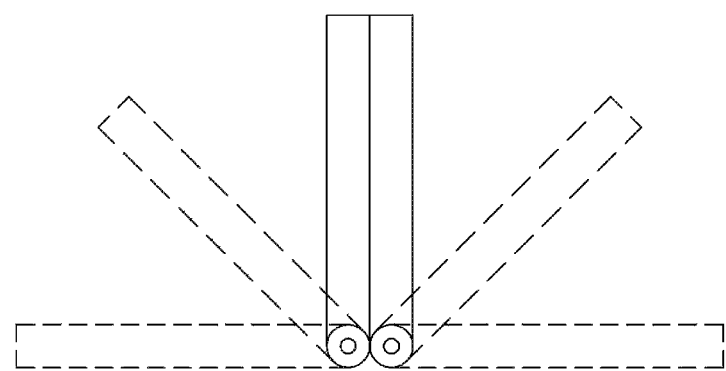

The flexible circuit board 1 having the vertical section 100 and the horizontal section 200 according to the embodiment of the present invention, as illustrated in FIG. 56, is disposed in the wireless terminal so that the horizontal section 200 passes through a hinge of the folded wireless terminal, so as to be usefully used for folding and unfolding operations of the wireless terminal many times.

We claim:

1. A flexible circuit board having a vertical section and a horizontal section, comprising:
   a first dielectric which has a first signal line in contact with an upper surface thereof, has a greater width than the first signal line, and extends along an extension direction of the first signal line;
   a second dielectric which is located below the first dielectric, has a second signal line in contact with the upper surface thereof, has a greater width than the second signal line, and extends along an extension direction of the second signal line;

a third dielectric which is located below the second dielectric, has a third signal line in contact with the upper surface thereof, has a greater width than the third signal line, and extends along an extension direction of the third signal line;

the vertical section which is a section in which the first signal line, the second signal line, and the third signal line are located on a same vertical line and the first signal line, the second signal line, and the third signal line extend in parallel; and the horizontal section which is a section in which positions of two or more of the first signal line, the second signal line, and the third signal line are changed through a via hole, so that the first signal line, the second signal line, and the third signal line are located on the same horizontal line, wherein the horizontal section includes:

a first horizontal section which is a section which extends from the vertical section and of which a position of two or more of the first signal line, the second signal line, and the third signal line are changed through the via hole; and a second horizontal section which is a section which extends from the first horizontal section so that the second horizontal section is thinner than the first horizontal section and intervals are formed between the first dielectric and the second dielectric and between the second dielectric and the third dielectric.

2. The flexible circuit board having the vertical section and the horizontal section of claim 1, wherein a position of the first signal line is changed to be in contact with the upper surface of the second dielectric through a first via hole so that the first signal line is spaced apart from the second signal line in a horizontal direction.

3. The flexible circuit board having the vertical section and the horizontal section of claim 2, wherein the horizontal section includes:

the first horizontal section which is a section which extends from the vertical section and in which a gap between the first dielectric and the second dielectric and a gap between the second dielectric and the third dielectric are bonded to each other by direct thermal melt bonding or by any one a bonding sheet and a prepreg as a medium; and the second horizontal section which is a section which extends from the and in which a gap between the first dielectric and the second dielectric and a gap between the second dielectric and the third dielectric are separated from each other without being bonded by the thermal melt bonding or the medium.

4. The flexible circuit board having the vertical section and the horizontal section of claim 3, further comprising:

a first sub dielectric which has a first sub ground in contact with the upper surface or lower surface thereof and is located between the first dielectric and the second dielectric;

a second sub dielectric which has a second sub ground in contact with the upper surface or lower surface thereof and is located between the second dielectric and the third dielectric;

a first side dielectric which has a first side ground in contact with the upper surface or lower surface thereof and is located on the first dielectric; and a second side dielectric which has a second side ground in contact with the upper surface or lower surface thereof and is located below the third dielectric, wherein in the second horizontal section, the first dielectric is separated from the first sub dielectric and the first side dielectric, and in the second horizontal section, the third dielectric is separated from the second sub dielectric and the second side dielectric.

5. The flexible circuit board having the vertical section and the horizontal section of claim 4, wherein in the second horizontal section, the second dielectric is separated from the first sub dielectric and the second sub dielectric.

6. The flexible circuit board having the vertical section and the horizontal section of claim 2, wherein the horizontal section includes:

the first horizontal section which is a section which extends from the vertical section and has the first via hole and the third via hole; and the second horizontal section which is a section in which the positions of the first signal line and the third signal line are changed through the first via hole and the third via hole, and wherein the horizontal section further includes:

a first ground which is in contact with the same surface in contact with the first signal line of the first dielectric so as to be formed around the first signal line in the vertical section and the first horizontal section;

a second ground which is in contact with the same surface in contact with the second signal line of the second dielectric so as to be formed around the second signal line in the vertical section and the first horizontal section; and a third ground which is in contact with the same surface in contact with the third signal line of the third dielectric so as to be formed around the third signal line in the vertical section and the first horizontal section.

7. The flexible circuit board having the vertical section and the horizontal section of claim 2, wherein in the horizontal section, the horizontal widths of the first dielectric, the second dielectric, and the third dielectric are larger than a width at which the first signal line and the third signal line are spaced from each other in the horizontal direction.

8. The flexible circuit board having the vertical section and the horizontal section of claim 2, wherein the horizontal section includes:

a first-A bending section which is a section in which the first signal line extends from the vertical section to be bent in a horizontal direction of the vertical section;

a first-A extension section which is a section in which the first signal line extends from the first-A bending section in a direction bent by the first-A bending section;

a first-B bending section which is a section in which the first signal line extends from the first-A extension section to be bent in a horizontal direction of the first-A extension section;

a first-B extension section which is a section in which the first signal line extends from the first-B bending section in a direction bent by the first-B bending section;

a first-A change section which is a section in which the position of the first signal line is changed to be in contact with the upper surface of the second dielectric through the first via hole; and a first-C extension section which is a section in which the first signal line extends from the first-A change section in the same direction as the first-B extension section.

9. The flexible circuit board having the vertical section and the horizontal section of claim 8, wherein the horizontal section further includes:
a second-A extension section in which the second signal line extends from the vertical section in the same direction as the vertical section.

10. The flexible circuit board having the vertical section and the horizontal section of claim 9, wherein the horizontal section includes:
a third-A bending section which is a section in which the third signal line extends from the vertical section to be bent in a horizontal direction of the vertical section;
a third-A extension section which is a section which the third signal line extends from the third-A bending section in a direction bent by the third-A bending section;
a third-B bending section which is a section which the third signal line extends from the third-A extension section to be bent in a horizontal direction of the third-A extension section;
a third-B extension section which is a section which the third signal line extends from the third-B bending section in a direction bent by the third-B bending section;
a third-A change section which is a section in which the position of the third signal line is changed to be in contact with the upper surface of the second dielectric through the third via hole; and
a third-C extension section which is a section in which the third signal line extends from the third-A change section in the same direction as the third-B extension section.

11. The flexible circuit board having the vertical section and the horizontal section of claim 2, wherein the horizontal section includes:
a first-A bending section which is a section in which the first signal line extends from the vertical section to be bent in a horizontal direction of the vertical section;
a first-B bending section which is a section in which the first signal line extends from the first-A bending section to be bent in a horizontal direction of a direction bent by the first-A bending section;
a first-B extension section which is a section in which the first signal line extends from the first-B bending section in a direction bent by the first-B bending section;
a first-A change section which is a section in which the position of the first signal line is changed to be in contact with the upper surface of the second dielectric through the first via hole;
a first-C extension section which is a section in which the first signal line extends from the first-A change section in the same direction as the first-B extension section;
a second-A extension section which is a section in which the second signal line extends from the vertical section in the same direction as the vertical section;
a third-A bending section which is a section in which the third signal line extends from the vertical section to be bent in a horizontal direction of the vertical section;
a third-B bending section which is a section in which the third signal line extends from the third-A bending section to be bent in a horizontal direction of a direction bent by the third-A bending section;
a third-B extension section which is a section which the third signal line extends from the third-B bending section in a direction bent by the third-B bending section;
a third-A change section which is a section in which the position of the third signal line is changed to be in contact with the upper surface of the second dielectric through the third via hole; and
a third-C extension section which is a section in which the third signal line extends from the third-A change section in the same direction as the third-B extension section.

12. The flexible circuit board having the vertical section and the horizontal section of claim 2, wherein the horizontal section includes:
a first-A bending section which is a section in which the first signal line extends from the vertical section to be bent in a horizontal direction of the vertical section;
a first-A extension section which is a section in which the first signal line extends from the first-A bending section in a direction bent by the first-A bending section;
a first-A change section which is a section in which the position of the first signal line is changed through the first via hole; and
a first-B extension section which is a section in which the first signal line extends from the first-A change section in the same direction as the first-A extension section.

13. The flexible circuit board having the vertical section and the horizontal section of claim 12, wherein the horizontal section includes:
a second-A bending section which is a section in which the second signal line extends from the vertical section to be bent in a horizontal direction of the vertical section; and
a second-A extension section which is a section in which the second signal line extends from the second-A bending section in a direction bent by the second-A bending section.

14. The flexible circuit board having the vertical section and the horizontal section of claim 2, wherein the horizontal section includes:
a third-A bending section which is a section in which the third signal line extends from the vertical section to be bent in a horizontal direction of the vertical section;
a third-A extension section which is a section which the third signal line extends from the third-A bending section in a direction bent by the third-A bending section;
a third-A change section which is a section in which the position of the third signal line is changed through the third via hole; and
a third-B extension section which is a section in which the third signal line extends from the third-A change section in the same direction as the third-A extension section.

15. The flexible circuit board having the vertical section and the horizontal section of claim 2, wherein the horizontal section includes:
a first-A bending section which is a section in which the first signal line extends from the vertical section to be bent in a horizontal direction of the vertical section;
a first-A extension section which is a section in which the first signal line extends from the first-A bending section in a direction bent by the first-A bending section;
a first-A change section which is a section in which the position of the first signal line is changed through the first via hole;
a first-B extension section which is a section in which the first signal line extends from the first-A change section in the same direction as the first-A extension section;

a first-B bending section which is a section which extends from the second-B extension section to be bent in a horizontal direction of the first-B extension section; and a first-C extension section which is a section in which the first signal line extends from the first-B bending section in a direction bent by the first-B bending section.

16. The flexible circuit board having the vertical section and the horizontal section of claim 15, wherein the horizontal section includes:

a second-A bending section which is a section in which the second signal line extends from the vertical section to be bent in a horizontal direction of the vertical section;

a second-A extension section which is a section in which the second signal line extends from the second-A bending section in a direction bent by the second-A bending section;

a second-B bending section which is a section which extends from the second-A extension section to be bent in a horizontal direction of the second-A extension section; and a second-B extension section which is a section in which the second signal line extends from the second-B bending section in a direction bent by the second-B bending section.

17. The flexible circuit board having the vertical section and the horizontal section of claim 2, wherein the horizontal section includes:

a third-A bending section which is a section in which the third signal line extends from the vertical section to be bent in a horizontal direction of the vertical section;

a third-A extension section which is a section which the third signal line extends from the third-A bending section in a direction bent by the third-A bending section;

a third-A change section which is a section in which the position of the third signal line is changed through the third via hole;

a third-B extension section which is a section in which the third signal line extends from the third-A change section in the same direction as the third-A extension section;

a third-B bending section which is a section which extends from the third-B extension section to be bent in a horizontal direction of the third-B extension section; and a third-C extension section which is a section in which the third signal line extends from the third-B bending section in a direction bent by the third-B bending section.

18. The flexible circuit board having the vertical section and the horizontal section of claim 1, wherein a conductive paste or an EMI shield film is in contact with at least one of the top and the bottom of the second horizontal section.

* * * * *